(12) United States Patent
Schmit et al.

(10) Patent No.: US 7,425,841 B2
(45) Date of Patent: Sep. 16, 2008

(54) CONFIGURABLE CIRCUITS, IC'S, AND SYSTEMS

(75) Inventors: Herman Schmit, Palo Alto, CA (US); Michael Butts, Portland, OR (US); Brad L. Hutchings, Fremont, CA (US); Steven Teig, Menlo Park, CA (US)

(73) Assignee: Tabula Inc., Santa Clara, CA (US)

( * ) Notice: Subject to any disclaimer, the term of this patent is extended or adjusted under 35 U.S.C. 154(b) by 174 days.

(21) Appl. No.: 10/883,486

(22) Filed: Jun. 30, 2004

(65) Prior Publication Data

US 2007/0241771 A1    Oct. 18, 2007

Related U.S. Application Data

(60) Provisional application No. 60/560,747, filed on Feb. 14, 2004.

(51) Int. Cl.
*H03K 19/173* (2006.01)

(52) U.S. Cl. .......................................... 326/38; 326/41

(58) Field of Classification Search ............. 326/37–41, 326/47
See application file for complete search history.

(56) References Cited

U.S. PATENT DOCUMENTS

| | | | |
|---|---|---|---|
| 4,873,459 A | 10/1989 | El Gamal et al. | |
| 5,349,250 A | 9/1994 | New | |
| 5,357,153 A | 10/1994 | Chiang et al. | |
| 5,365,125 A | 11/1994 | Goetting et al. | |
| 5,426,378 A * | 6/1995 | Ong ............................. | 326/39 |
| 5,521,835 A | 5/1996 | Trimberger | |
| 5,552,721 A | 9/1996 | Gould | |
| 5,600,263 A | 2/1997 | Trimberger et al. | |
| 5,610,829 A | 3/1997 | Trimberger | |
| 5,629,637 A | 5/1997 | Trimberger et al. | |
| 5,631,578 A | 5/1997 | Clinton et al. | |
| 5,646,544 A | 7/1997 | Iadanza | |
| 5,646,545 A | 7/1997 | Trimberger et al. | |
| 5,659,484 A | 8/1997 | Bennett et al. | |
| 5,692,147 A | 11/1997 | Larsen et al. | |
| 5,694,057 A | 12/1997 | Gould | |
| 5,701,441 A | 12/1997 | Trimberger | |
| 5,719,889 A | 2/1998 | Iadanza | |
| 5,732,246 A | 3/1998 | Gould et al. | |
| 5,737,235 A | 4/1998 | Kean et al. | |
| 5,745,422 A | 4/1998 | Iadanza | |
| 5,745,734 A | 4/1998 | Craft et al. | |

(Continued)

OTHER PUBLICATIONS

U.S. Appl. No. 10/882,583, filed Jun. 30, 2004, Schmit.

(Continued)

*Primary Examiner*—James H. Cho
(74) *Attorney, Agent, or Firm*—Adeli & Tollen LLP

(57) ABSTRACT

Some embodiments of the invention provide a configurable integrated circuit (IC). The IC includes a logic circuit for receiving input data sets and configuration data sets and performing several functions on the input data sets. Each configuration data set specifies a particular function that the logic circuit has to perform on the input data set. The IC also includes a connection circuit for supplying sets of the configuration data to the logic circuit at a particular rate for at least a particular time period. At least two supplied configuration data sets are different and configure the logic circuit to perform two different functions on the input data.

30 Claims, 21 Drawing Sheets

U.S. PATENT DOCUMENTS

| | | | |
|---|---|---|---|
| 5,760,602 A | 6/1998 | Tan | |
| 5,764,954 A | 6/1998 | Fuller et al. | |
| 5,777,360 A | 7/1998 | Rostoker et al. | |
| 5,802,003 A | 9/1998 | Iadanza et al. | |
| 5,815,726 A | 9/1998 | Cliff | |
| 5,825,662 A | 10/1998 | Trimberger | |
| 5,889,411 A | 3/1999 | Chaudhary | |
| 5,914,616 A | 6/1999 | Young et al. | |
| 5,914,906 A | 6/1999 | Iadanza et al. | |
| 5,982,655 A | 11/1999 | Doyle | |
| 6,002,991 A | 12/1999 | Conn, Jr. | |
| 6,023,421 A | 2/2000 | Clinton et al. | |
| 6,038,192 A | 3/2000 | Clinton et al. | |
| 6,044,031 A | 3/2000 | Iadanza et al. | |
| 6,054,873 A | 4/2000 | Laramie | |
| 6,069,490 A | 5/2000 | Ochotta et al. | |
| 6,075,745 A | 6/2000 | Gould et al. | |
| 6,084,429 A | 7/2000 | Trimberger | |
| 6,086,631 A | 7/2000 | Chaudhary et al. | |
| 6,091,263 A * | 7/2000 | New et al. | 326/40 |
| 6,091,645 A | 7/2000 | Iadanza | |
| 6,107,821 A | 8/2000 | Kelem et al. | |
| 6,110,223 A | 8/2000 | Southgate et al. | |
| 6,118,707 A | 9/2000 | Gould et al. | |
| 6,130,854 A | 10/2000 | Gould et al. | |
| 6,140,839 A | 10/2000 | Kaviani et al. | |
| 6,150,838 A | 11/2000 | Wittig et al. | |
| 6,163,168 A | 12/2000 | Nguyen et al. | |
| 6,172,521 B1 | 1/2001 | Motomura | |
| 6,175,247 B1 | 1/2001 | Scalera et al. | |
| 6,184,707 B1 | 2/2001 | Norman et al. | |
| 6,233,191 B1 | 5/2001 | Gould et al. | |
| 6,275,064 B1 | 8/2001 | Agrawal et al. | |
| 6,292,019 B1 | 9/2001 | New et al. | |
| 6,326,807 B1 | 12/2001 | Veenstra et al. | |
| 6,348,813 B1 | 2/2002 | Agrawal et al. | |
| 6,381,732 B1 | 4/2002 | Burnham et al. | |
| 6,404,224 B1 | 6/2002 | Azegami et al. | |
| 6,469,540 B2 | 10/2002 | Nakaya | |
| 6,480,954 B2 | 11/2002 | Trimberger | |
| 6,487,709 B1 | 11/2002 | Keller et al. | |
| 6,490,707 B1 | 12/2002 | Baxter | |
| 6,515,509 B1 | 2/2003 | Baxter | |
| 6,526,559 B2 | 2/2003 | Schiefele et al. | |
| 6,529,040 B1 | 3/2003 | Carberry et al. | |
| 6,545,501 B1 | 4/2003 | Bailis et al. | |
| 6,593,771 B2 | 7/2003 | Bailis et al. | |
| 6,601,227 B1 | 7/2003 | Trimberger | |
| 6,603,330 B1 * | 8/2003 | Snyder | 326/37 |
| 6,629,308 B1 | 9/2003 | Baxter | |
| 6,636,070 B1 | 10/2003 | Altaf | |
| 6,642,744 B2 | 11/2003 | Or-Bach et al. | |
| 6,667,635 B1 | 12/2003 | Pi et al. | |
| 6,668,361 B2 | 12/2003 | Bailis et al. | |
| 6,675,309 B1 | 1/2004 | Baxter | |
| 6,703,861 B2 | 3/2004 | Ting | |
| 6,714,041 B1 * | 3/2004 | Darling et al. | 326/38 |
| 6,717,436 B2 | 4/2004 | Kress et al. | |
| 6,732,068 B2 | 5/2004 | Sample et al. | |
| 6,806,730 B2 | 10/2004 | Bailis et al. | |
| 6,829,756 B1 | 12/2004 | Trimberger | |
| 6,831,479 B2 | 12/2004 | Lo | |
| 6,838,902 B1 | 1/2005 | Elftmann et al. | |
| 6,924,663 B2 * | 8/2005 | Masui et al. | 326/38 |
| 6,992,505 B1 | 1/2006 | Zhou | |
| 7,030,651 B2 | 4/2006 | Madurawe | |
| 7,064,577 B1 | 6/2006 | Lee | |
| 7,109,752 B1 | 9/2006 | Schmit et al. | |
| 7,112,992 B1 | 9/2006 | Guzman et al. | |
| 7,126,372 B2 | 10/2006 | Vadi et al. | |
| 7,126,373 B1 | 10/2006 | Schmit et al. | |
| 7,126,381 B1 | 10/2006 | Schmit et al. | |
| 7,126,856 B2 | 10/2006 | Sun et al. | |
| 7,129,746 B1 | 10/2006 | Balasubramanian et al. | |
| 7,138,827 B1 | 11/2006 | Trimberger | |
| 7,157,933 B1 | 1/2007 | Schmit et al. | |
| 7,167,025 B1 | 1/2007 | Schmit et al. | |
| 7,193,432 B1 | 3/2007 | Schmit et al. | |
| 7,193,440 B1 | 3/2007 | Schmit et al. | |
| 2001/0007428 A1 | 7/2001 | Young et al. | |
| 2002/0008541 A1 | 1/2002 | Young et al. | |
| 2002/0010853 A1 | 1/2002 | Trimberger et al. | |
| 2002/0113619 A1 | 8/2002 | Wong | |
| 2002/0125914 A1 | 9/2002 | Kim | |
| 2002/0161568 A1 | 10/2002 | Sample et al. | |
| 2002/0163357 A1 | 11/2002 | Ting | |
| 2003/0042931 A1 | 3/2003 | Ting | |
| 2003/0080777 A1 | 5/2003 | Baxter | |
| 2003/0110430 A1 | 6/2003 | Bailis et al. | |
| 2004/0103265 A1 | 5/2004 | Smith | |
| 2004/0105207 A1 | 6/2004 | Spadema et al. | |
| 2004/0196066 A1 | 10/2004 | Ting | |
| 2005/0134308 A1 | 6/2005 | Okada et al. | |
| 2007/0075737 A1 | 4/2007 | Schmit et al. | |
| 2007/0241776 A1 | 10/2007 | Schmit et al. | |
| 2007/0241777 A1 | 10/2007 | Schmit et al. | |
| 2007/0241787 A1 | 10/2007 | Schmit et al. | |
| 2007/0241788 A1 | 10/2007 | Schmit et al. | |
| 2007/0241791 A1 | 10/2007 | Schmit et al. | |

OTHER PUBLICATIONS

U.S. Appl. No. 10/883,276, filed Jun. 30, 2004, Schmit.
U.S. Appl. No. 10/882,946, filed Jun. 30, 2004, Schmit.
U.S. Appl. No. 10/882,839, filed Jun. 30, 2004, Schmit.
U.S. Appl. No. 10/882,579, filed Jun. 30, 2004, Schmit.
U.S. Appl. No. 10/883,213, filed Jun. 30, 2004, Schmit.
U.S. Appl. No. 10/883,051, filed Jun. 30, 2004, Schmit.
U.S. Appl. No. 10/882,583 (office action), filed Jun. 30, 2004, Schmit.
U.S. Appl. No. 10/883,276 (office action), filed Jun. 30, 2004, Schmit.
U.S. Appl. No. 10/882,946 (office action), filed Jun. 30, 2004, Schmit.
U.S. Appl. No. 10/882,839 (office action), filed Jun. 30, 2004, Schmit.
U.S. Appl. No. 10/882,579 (office action), filed Jun. 30, 2004, Schmit.
U.S. Appl. No. 10/883,213 (office action), filed Jun. 30, 2004, Schmit.
U.S. Appl. No. 10/883,051 (office action), filed Jun. 30, 2004, Schmit.
"§3 Programmable Logic Devices," *Digital System Design*, 2001, pp. 3.1-3.28.
"Design for Low Power in Actel Antifuse FPGAs", Actel Application Note, 2000 Actel Corporation, Sep. 2000, pp. 1-8.
"The Effect of SRAM Table Sharing and Cluster Size on FPGA Area", pp. 1-10, no date.
"The Xilinx Virtex Series FPGA," Jan. 22, 2001, slides 1-22.
"Unifying Sequential and Spatial Computing with a Single Instruction Set Architecture," *ISCA '04*, 2004, ACM, Munchen, Oberbayem, Germany.
Agrawal, O., et al., "An Innovative, Segmented High Performance FPGA Family with Variable-Grain-Architecture and Wide-gating Functions," *FPGA 99*, 1999, pp. 17-26, ACM, Monterey, CA, USA.
Ahmed, E., et al., "The Effect of LUT and Cluster Size on Deep-Submicron FPGA Performance and Density," *FPGA 2000*, 2000, ACM, Monterey, CA, USA.
Altera Corp., "6. DSP Blocks in Stratix II Devices," *SII52006-1.0*, Feb. 2004, pp. 1-32.
Altera, "Stratix II DSP Performance," *White Paper*, Feb. 2004, pp. 1-9, ver. 1.0, Altera Corporation, San Jose, CA.

Backus, J., "Can Programming be Liberated from the Von Neumann Style? A Functional Style and its Algebra of Programs," *Communications of the ACM*, Aug. 1978, pp. 613-641, vol. 21, No. 8, ACM.

Barker, R., "QuickSilver ACM SilverStream Design Methodology with the Inspire SDK Tool Set," *A Technology Application Whitepaper*, 2004, pp. 1-8, QuickSilver Technology, Inc., San Jose, California.

Butts, M., "Future Directions of Dynamically Reprogrammable Systems," *IEEE 1995 Custom Integrated Circuits Conference*, 1995, pp. 487-494, IEEE.

Camposano, R., "The Growing Semiconductor Zoo: ASICs, CSSP, ASSP, ASIP, Structured Arrays, FPGAs, Processor Arrays, Platforms . . . and Other Animalia," 2003, pp. 1-74, Synopsys, Inc.

Caspi, E., et al., "A Streaming Multi-Threaded Model," *MSP-3*, Dec. 2, 2001, pp. 1-23.

Caspi, E., et al., "Stream Computations Organized for Reconfigurable Executiion (SCORE): Introduction and Tutorial," Aug. 25, 2000, pp. 1-31, Version 1.0.

Compton, K., et al., "An Introduction to Reconfigurable Computing," no date.

Compton, K., et al., "Reconfigurable Computing: A Survey of Systems and Software," *ACM Computing Surveys*, Jun. 2002, pp. 171-210, vol. 34, No. 2, ACM, New York, NY.

Cong, J., et al., "Combinational Logic Synthesis for LUT Based Field Programmable Gate Arrays," *ACM Transactions on Design Automation of Electronic Systems*, Apr. 1996, pp. 145-204, vol. 1, No. 2, ACM, Inc.

Davare, A., et al., "The Best of Both Worlds: The Efficient Asynchronous Implementation of Synchronous Specifications," *DAC '04*, Jun. 7-11, 2004, ACM, San Diego, California, USA.

Dehon, A., Balancing Interconnect and Computation in a Reconfigurable Computing Array (or, why don't you really want 100% LUT utilization). pp. 1-10. (Applicants believe that this article also appears in *Proceedings of the International Symposium on Field Programmable Gate Arrays*, Feb. 1999, pp. 125-134).

Dehon, A., "DPGA Utilization and Application," no date.

Dehon, A., "Dynamically Programmable Gate Arrays: A Step Toward Increased Computational Density," *Proceedings of the Fourth Canadian Workshop on Field-Programmable Devices*, May 1996, pp. 47-54.

Dehon, A., "Reconfigurable Architectures for General-Purpose Computing," *A.I. Technical Report No. 1586*, Oct. 1996, pp. i-353.

Dehon, A., "The Density Advantage of Configurable Computing," Apr. 2000, pp. 41-49, IEEE.

Dehon, A., "Transit Note #121: Notes on Programmable Interconnect," *M.I.T. Transit Project*, Feb. 1995, pp. 1-13.

Dehon, A., et al., "Design Patterns for Reconfigurable Computing," *Proceedings of the IEEE Symposium on Field-Programmable Custom Computing Machines*, Apr. 2004.

Dehon, A., et al., "DPGA-Coupled Microprocessors: Commodity ICs for the Early 21$^{st}$ Century," *FCCM '94-IEEE Workshop on FPGAs for Custom Computing Machines*, Apr. 10-13.

Dehon, A., et al., "Reconfigurable Computing: What, Why, and Implications for Design Automation," *DAC 99*, New Orleans, Louisiana, 1999, ACM.

Enzler, R., et al., "Virtualizing Hardware with Multi-Context Reconfigurable Arrays," pp. 151-160, no date.

Gayasen, A., et al., "Reducing Leakage Energy in FPGAs Using Region-Constrained Placement," *FPGA '04*, Feb. 22-24, 2004, pp. 51-58, ACM, Monterey, California, USA.

George, V., "Low Energy Field-Programmable Gate Array," *A Dissertation Submitted in Partial Satisfaction o the Requirements for the Degree of Doctor of Philosophy in Engineering-Electrical Engineering and Computer Sciences in the Graduate Division of the University of California, Berkeley, Fall 2000*, pp. 1-190.

Giraud-Carrier, C., "A Reconfigurable Data Flow Machine for Implementing Functional Programming Languages," no date.

Goldstein, S.C., et al., "PipeRench: A Coprocessor for Streaming Multimedia Acceleration," no date.

Goldstein, S.C., et al., "PipeRench: A Reconfigurable Architecture and Compiler," 2000, pp. 70-77, IEEE.

Hauck, S., et al., "Montage: An FPGA for Synchronous and Asynchronous Circuits," pp. 1-4. (Applicants believe that this article also appears in *Field-Programmable Gate Arrays: Architectures and Tools for Rapid Prototyping*, 1993, pp. 44-51, Springer-Verlag, Berlin).

Hauck, S., et al., "Totem: Domain-Specific Reconfigurable Logic," pp. 1-25, no date.

Heidari, G., et al., "Introducing a Paradigm Shift in the Design and Implementation of Wireless Devices," *A Wireless Devices Whitepaper*, Apr. 28, 2004 but © 2003, pp. 1-10, QuickSilver Technology, Inc., San Jose, California.

Hofstee, H.P., "Cell Broadband Engine Architecture from 20,000 Feet," Aug. 24, 2005, pp. 1-6.

Huang, A.S., "Tao: An Architecturally Balanced Reconfigurable Hardware Processor," *Submitted to the Dept. of Electrical Engineering and Computer Science in Partial Fulfillment of the Requirements for the Degrees of Bachelor of Science in Electrical Science and Engineering and Master of Engineering in Electrical Engineering and Computer Science at the Massachusetts Institute of Technology*, May 23, 1997, pp. 1-86, 107-109.

IBM, "Cell Broadband Engine Architecture, Version 1.0," Aug. 8, 2005, pp. 1-319, USA.

IBM, "SPU Application Binary Interface Specification, Version 1.3," *CBEA JSRE Series*, Aug. 1, 2005, pp. iv-26, USA.

IBM, "SPU Assembly Language Specification, Version 1.2," *CBEA JSRE Series*, Aug. 1, 2005, pp. iii-22, USA.

IBM, "SPU C/C++ Language Extensions, Version 2.0" *CBEA JSRE Series*, Aug. 1, 2005, pp. iv-84, USA.

IBM, "Synergistic Processor Unit Instruction Set Architecture, Version 1.0," Aug. 1, 2005, pp. 1-257, USA.

Kaviani, A., et al., "Computational Field Programmable Architecture," no date.

Kaviani, A., et al., "Hybrid FPGA Architecture," Department of Electrical and Computer Engineering, University of Toronto, Canada, no date.

Keutzer, K., "Overview of configurable architectures," slides 1-29, no date.

Kocan, F., et al., "Logic Modules with Shared SRAM Tables for Field-Programmable Gate Arrays," *FPL 2004*, 2004, pp. 289-300, Springer-Verlag, Berlin Heidelberg.

Lehn, D.I., et al., "Evaluation of Rapid Context Switching on a CSRC Device," no date.

Lemieux, G., et al., "Generating Highly-Routable Sparse Crossbars for PLDs," *FPGA 2000*, 2000, ACM, Monterey, California, USA.

Lemieux, G., et al., "Using Sparse Crossbars within LUT Clusters," *FPGA 2001*, Feb. 11-13, 2001, ACM, Monterey, CA.

Lertora, F., et al., "Handling Different Computational Granularity by a Reconfigurable IC Featuring Embedded FPGAs and a Network-On-Chip," no date.

Lewis, D., et al., "The Stratix-II Routing and Logic Architecture," pp. 1-22, no date.

Ling, A., "The Search for the Optimal FPGA Logic Block," 2001, ACM.

M2000, "FlexEOS Embedded FPGA Cores," 2003, M2000.

Markovskiy, Y., et al., "Analysis of Quasi-Static Scheduling Techniques in a Virtualized Reconfigurable Machine," *FPGA '02*, Feb. 24-26, 2002, ACM, Monterey, California, USA.

Master, P., "The Next Big Leap in Reconfigurable Systems," *A Technology Vision Whitepaper*, Apr. 28, 2004 but © 2003, pp. 1-8, QuickSilver Technology, Inc., San Jose, California.

MathStar, Inc., "MathStar FPOA Architecture: A New Approach to High Throughput, Scalable, and Reprogrammable Design," *Technology Overview*, 2003, MathStar, Inc..

Mirsky, E., et al., "MATRIX: A Reconfigurable Computing Architecture with Configurable Instruction Distribution and Deployable Resources," *Proceedings of the IEEE Workshop on FPGAs for Custom Computing Machines*, Apr. 1996.

Mirsky, E., et al., "MATRIX: A Reconfigurable Computing Device with Configurable Instruction Distribution and Deployable Resources," *Hot Chips Symposium 1997*, 1997.

Morris, K., "Lattice Launches XP: Non-Volatility at the Forefront of FPGA," *FPGA and Programmable Logic Journal*, 2005, pp. 1-5, Techfocus Media, Inc.

Morris, K., "Rationalizing Reconfigurability: The Importance of Being Programmable," *FPGA and Structured ASIC Journal*, Sep. 27, 2005.

Nelson, B.E., "Reconfigurable Computing: An Introduction and Overview," Sep. 23, 1998, pp. 1-43.

Niedzielski, D., "An Overview of Reconfigurable Computing," no date.

Ochotta, E.S., et al., "A Novel Predictable Segmented FPGA Routing Architecture," *FPGA 98*, 1998, pp. 3-11, ACM, Monterey, CA, USA.

Ohkura, J., et al., "Dataflow in the Adaptive Computing Machine (ACM)," *A Technology Application Whitepaper*, Apr. 28, 2004 but © 2003, pp. 1-9, QuickSilver Technology, Inc., San Jose, California.

Parhami, B., "Part IV: Low-Diameter Architectures," *ECE 254B: Advanced Comptuer Architecture: Parallel Processing, UCSB*, Spring 2005, slides 1-93, Behrooz Parhami, Santa Barbara, CA.

Patel, C., et al., "An Architectural Exploration of Via Patterned Gate Arrays," pp. 184-189, no date.

Patel, C., et al., "An Architectural Exploration of Via Patterned Gate Arrays," *Carnegie Mellon University Center for Silicon System Implementation*, no date.

Pedram, M., "IEEE Circuits and Systems Society Distinguished Lecturer Program," no date.

Perissakis, S., et al., "Embedded DRAM for a Reconfigurable Array," no date.

Perissakis, S., et al., "Embedded DRAM for a Reconfigurable Array," *Proceedings of the 1999 Symposium on VLSI Circuits*, Jun. 1999.

Plunkett, B., "In Search of the SDR Holy Grail," *A Technology Application Whitepaper*, Apr. 28, 2004 but © 2003, pp. 1-7, QuickSilver Technology, Inc., San Jose, California.

Plunkett, B., et al., "Adapt2400 ACM Architecture Overview," *A Technology Whitepaper*, 2004, pp. 1-9, QuickSilver Technology, Inc.

QuickLogic Corp., "Ultra-Low Power FPGA Combining Performace, Density, and Embedded RAM," *Eclipse II Family Data Sheet*, 2005, pp. 1-92, QuickLogic Corporation, US.

QuickSilver Technology, Inc., "Adapt2000 ACM System Platform," Apr. 2004, pp. 1-39, QuickSilver Technology, Inc., San Jose, California.

QuickSilver Technology, Inc., "InSpire SDK Tool Set," *Product Brief*, 2004, QuickSilver Technology, Inc., San Jose, California.

QuickSilver Technology, Inc., "QS2412 Adaptive Computing Machine," *Product Brief*, 2004, QuickSilver Technology, Inc., San Jose, California.

Rahman, A., et al., "Wiring Requirement and Three-Dimensional Integration Technology for Field Programmable Gate Arrays," *IEEE Transactions on Very Large Scale Integration (VLSI) Systems*, Feb. 2003, pp. 44-54, vol. 11, No. 1, IEEE.

Rose, J., "Hard vs. Soft: The Central Question of Pre-Fabricated Silicon," pp. 1-4, no date.

Sambhwani, S., et al., "Implementing W-CDMA Transceiver Structure on an Adaptive Computing Platform," *A Technology Application Whitepaper*, Apr. 28, 2004 but © 2003, pp. 1-12, QuickSilver Technology, Inc., San Jose, California.

Scalera, S.M., et al., "A Mathematical Benefit Analysis of Context Switching Reconfigurable Computing," no date.

Schaumont,P., et al., "A Quick Safari Through the Reconfiguration Jungle," no date.

Schmit, H., "Extra-Dimensional Island-Style FPGAs," 2003.

Schmit, H., "Extra-dimensional Island-Style FPGAs," pp. 1-10, no date.

Schmit, H., "Incremental Reconfiguration for Pipelined Applications," no date.

Schmit, H., et al., "FPGA Switch Block Layout and Evaluation," *FPGA '02*, Feb. 24-26, 2002, ACM, Monterey, California, USA.

Schmit, H., et al., "PipeRench: A Virtualized Programmable Datapath in 0.18 Micron Technology,".

Schmit, H., et al., "Queue Machines: Hardware Compilation in Hardware," no date.

Sharma, A., et al., "Accelerating FPGA Routing Using Architecture-Adaptive A Techniques" no date.

Singh, A., et al., "Interconnect Pipelining in a Throughput-Intensive FPGA Architecture," *FPGA 2001*, Feb. 11-13, 2001, pp. 153-160, ACM, Monterey, CA, USA.

Singh, A., et al., "PITIA: An FPGA for Throughput-Intensive Applications," *IEEE Transactions on Very Large Scale Integration (VLSI) Systems*, Jun. 2003, pp. 354-363, vol. 11, No. 3, IEEE.

Slade, A.L., et al., "Reconfigurable Computing Application Frameworks," no date.

Snider, G., "Performance-Constrained Pipelining of Software Loops onto Reconfigurable Hardware," *FPGA '02*, Feb. 24-26, 2002, pp. 177-186, ACM, Monterey, California, USA.

Tau, E., et al., "A First Generation DPGA Implementation," *Proceedings of the Third Canadian Workshop on Field-Programmable Devices*, May 1995, pp. 138-143.

Tau, E., et al., "Transit Note #114: A First Generation DPGA Implementation," *M.I.T. Transit Project*, Jan. 1995, pp. 1-8.

Taylor, R., et al., "Enabling Energy Efficiency in Via-Patterned Gate Array Devices," no date.

Teifel, J., et al., "Highly Pipelined Asynchronous FPGAs" *FPGA '04*, ACM, Monterey, California, USA, no date.

Tessier, R., et al., "Balancing Logic Utilization and Area Efficiency in FPGAs," no date.

Tom, M., et al., "Logic Block Clustering of Large Designs for Channel-Width Constrained FPGAs," *DAC 2005*, Jun. 13-17, 2005, pp. 726-731, ACM, Anaheim, California, USA.

Tom, M., et al., "Clustering of Large Designs for Channel-Width Constrained FPGAs," Univsersity of British Columbia, Department of Electrical and Computer Engineering, slides 1-39, Vancouver, BC, Canada, no date.

Tong, K.T., et al., "Regular Logic Fabrics for a Via Patterned Gate Array (VPGA),". no date.

Trimberger, S., "Effects of FPGA Architecture on FPGA Routing," $32^{nd}$ *ACM/IEEE Design Automation Conference*, 1995, ACM.

Tsu, W., et al., "HSRA: High-Speed, Hierarchical Synchronous Reconfigurable Array," pp. 1-10. (Applicants believe that this also appears in *Proceedings of the International Symposium on Field Programmable Gate Arrays*, Feb. 1999, pp. 69-78).

Wawrzynek, J., "EECS150-Digital Design: Lecture 5—Field Programmable Gate Arrays (FPGAs)," Feb. 4, 2002, pp. 1-4, slides 1-20, multiple slides per page.

Weaver, N., et al., "The SFRA: A Corner-Turn FPGA Architecture," *FPGA '04*, Feb. 22-24, 2004, ACM, Monterey, California, USA.

Wilton, S.J.E., "Memory-to-Memory Connection Structures in FPGAs with Embedded Memory Arrays," *FPGA 97*, 1997, pp. 10-16, ACM, Monterey, California, USA.

Xilinx, Inc., "Virtex-4 Family Overview," *Advance Product Specification*, Sep. 10, 2004, pp. 21-30, v1.1, Xilinx, Inc.

Zilic, Z. et al., "Using BDDs to Design ULMs for FPGAs," pp. 1-10, no date.

Zuchowski, P.S., "A Hybrid ASIC and FPGA Architecture," 2002, IEEE.

U.S. Appl. No. 11/535,053, filed Sep. 25, 2006, Schmit et al.

Notice of Allowance for U.S. Appl. No. 10/882,583, Aug. 21, 2006, Schmit et al., Notice of Allowance of Commonly Owned U.S. Appl. No. 10/882,583, now U.S. Patent 7,157,933.

Final Office Action for U.S. Appl. No. 10/882,583, Apr. 05, 2006, Schmit et al., Final Office Action of Commonly Owned U.S. Appl. No. 10/882,583, now U.S. Patent 7,157,933.

Non-Final Office Action for U.S. Appl. No. 10/882,583, Oct. 27, 205, Schmit et al., Non-Final Office Action of Commonly Owned U.S. Appl. No. 10/882,583, now U.S. Patent 7/109,752.

Notice of Allowance for U.S. Appl. No. 10/883,276, Apr. 24, 2006, Schmit et al., Notice of Allowance of Commonly Owned U.S. Appl. No. 10/883,276, now U.S. Patent 7,157,933.

Non-Final Office Action for U.S. Appl. No. 10/883,276, Dec. 27, 2005, Schmit et al., Non-Final Office Action of commoly Owned U.S. Appl. No. 10/883,276, now U.S. Patent 7/109,752.

Notice of Allowance for U.S. Appl. No. 10/882,946, Sep. 28, 2006, Schmit et al., Notice of Allowance of Commonly Owned U.S. Appl. No. 10/882,946, now U.S. Patent 7,193,440.

Final Office Action for U.S. Appl. No. 10/882,946, Jun. 05, 2006, Schmit et al., Final Office Action of Commonly Owned U.S. Appl. No. 10/882,946, now U.S. Patent 7,193,440.

Non-Final Office Action for U.S. Appl. No. 10/882,946, Oct. 26, 2005, Schmit et al., Non-Final Office Action of Commonly Owned U.S. Appl. No. 10/882,946, now U.S. Patent 7,193,440.

Supplemental Notice of Allowance for U.S. Appl. No. 10/882,839, Aug. 24, 2006, Schmit et al., Supplemental Notice of Allowance of Commonly Owned U.S. Appl. No. 10/882,839, now U.S. Patent 7,126,373.

Notice of Allowance for U.S. Appl. No. 10/882,839, Jun. 12, 2006, Schmit et al., Notice of Allowance of Commonly Owned U.S. Appl. No. 10/882,839, now U.S. Patent 7,126,373.

Non-Final Office Action for U.S. Appl. No. 10/882,839, Nov. 29, 2005, Schmit et al., Non-Final Office Action Commonly Owned U.S. Appl. No. 10/882,839, now U.S. Patent 7,126,373.

Notice of Allowance for U.S. Appl. No. 10/882,579, Aug. 22, 2006, Schmit et al., Notice of Allowance of Commonly Owned U.S. Appl. No. 10/882,579, now U.S. Patent 7,193,432.

Notice of Allowance for U.S. Appl. No. 10/882,579, Apr. 07, 2006, Schmit et al., Notice of Allowance of Commonly Owned U.S. Appl. No. 10/882,579, now U.S. Patent 7,193,432.

Non-Final Office Action for U.S. Appl. No. 10/882,579, Oct. 17, 2005, Schmit et al., Non-Final Office Ac tion of Commonly Owned U.S. Appl. No. 10/882,579, now U.S. Patent 7,193,432.

Notice of Allowance for U.S. Appl. No. 10/883,213 Jun. 12, 2006, Schmit et al., Notice of Allowance of Commonly Owned U.S. Appl. No. 10/883,213, now U.S. Patent 7,126,381.

Non-Final Office Action for U.S. Appl. No. 10/883,213, Oct. 17, 2005, Schmit et al., Non-Final Action of Commonly Owned U.S. Appl. No. 10/883,213, now U.S. Patent 7,126,381.

Notice of Allowance for U.S. Appl. No. 10/883,051, Sep. 07, 2006, Schmit et al., Notice of Allowance of Commonly Owned U.S. Appl. No. 10/883,051, now U.S. Patent 7,167,025.

Final Office Action for U.S. Appl. No. 10/883,051, Apr. 03, 2006, Schmit et al., Final Office Action of Commonly Owned U.S. Appl. No. 10/883,051, now U.S. Patent 7,167,025.

Non-Final Office Action for U.S. Appl. No. 10/883,051, Oct. 26, 2005, Schmit et al., Non-Final Office Action of Comonly Owned U.S. Appl. No. 10/883,051, now U.S. Patent 7,167,025.

Non-Final Office Action for U.S. Appl. No. 11/565,592, Jun. 25, 2007, Schmit et al., Non-Final Office Action of Commonly Owned U.S. Appl. No. 11/565,592, now U.S. Published 2007/0241787.

Non-Final Office Action for U.S. Appl. No. 11/467,918, Jan. 04, 2008, Schmit et al., Non-Final Office Action of Commonly Owned U.S. Appl. No. 11/467,918, now U.S. Published Application 2007/0075737.

Non-Final Office Action for U.S. Appl. No. 11/617,671, Aug. 15, 2007, Schmit et al., Non-Final Office Action of Commonly Owned U.S. Appl. No. 11/617,671, now U.S. Published Application 2007/241777.

Notice of Allowance for U.S. Appl. No. 11/535,058, Oct. 10, 2007, Schmit et al., Notice of Allowance of Commonly Owned U.S. Appl. No. 11/535,058, now U.S. Published Application 2007/0241776.

Non-Final Office Action for U.S. Appl. No. 11/535,058, Mar. 15, 2007, Schmit et al., Non-Final Office Action of Commonly Owned U.S. Appl. No. 11/535,058, now U.S. Published Application 2007/0241776.

Final Office Action for U.S. Appl. No. 11/565,607, Jan. 04, 2008, Schmit et al., Final Office Action of Commonly Owned U.S. Appl. No. 11/565,607, now U.S. Published Application 2007/0241788.

Non-Final Office Action for U.S. Appl. No. 11/565,607, May 24, 2007, Schmit et al., Non-Final Office Action of Commonly Owned U.S. Appl. No. 11/565,607, now U.S. Published Application 2007/0241788.

Final Office Action for U.S. Appl. No. 11/535,053, Sep. 06, 2007, Schmit et al., Final Office Action of Commonly Owned U.S. Appl. No. 11/535,053.

Non-Final Office Action for U.S. Appl. No. 11/535,053, Jan. 29, 2007, Schmit et al., Non-Final Office Action of Commonly Owned U.S. Appl. No. 11/535,053.

* cited by examiner

CONFIGURABLE CIRCUITS, IC'S, AND SYSTEMS

CLAIM OF BENEFIT TO PRIOR APPLICATION

This patent application claims benefit of an earlier-filed U.S. Provisional Patent Application entitled "Configurable Integrated Circuits with Programmable Vias," filed on Feb. 14, 2004, and having Ser. No. 60/560,747.

CROSS REFERENCE TO RELATED APPLICATIONS

This Application is related to the following applications: U.S. patent application Ser. No. 10/882,583 filed on Jun. 30, 2004; U.S. patent application Ser. No. 10/883,276 filed on Jun. 30, 2004; U.S. patent application Ser. No. 10/882,946 filed on Jun. 30, 2004; U.S. patent application Ser. No. 10/882,839 filed on Jun. 30, 2004; U.S. patent application Ser. No. 10/882,579 filed on Jun. 30, 2004; U.S. patent application Ser. No. 10/883,213 filed on Jun. 30, 2004; and U.S. patent application Ser. No. 10/883,051 filed on Jun. 30, 2004.

FIELD OF THE INVENTION

The present invention is directed towards configurable circuits, IC's, and systems.

BACKGROUND OF THE INVENTION

The use of configurable integrated circuits ("IC's") has dramatically increased in recent years. One example of a configurable IC is a field programmable gate array ("FPGA"). An FPGA is a field programmable IC that has an internal array of logic circuits (also called logic blocks) that are connected together through numerous interconnect circuits (also called interconnects) and that are surrounded by input/output blocks. Like some other configurable IC's, the logic circuits and interconnect circuits of an FPGA are configurable.

FIG. 1 illustrates an example of a configurable logic circuit 100. This logic circuit can be configured to perform a number of different functions. As shown in FIG. 1, the logic circuit 100 receives a set of input data 105 and a set of configuration data 110. The configuration data set is stored in a set of SRAM cells 115. From the set of functions that the logic circuit 100 can perform, the configuration data set specifies a particular function that this circuit has to perform on the input data set. Once the logic circuit performs its function on the input data set, it provides the output of this function on a set of output lines 120. The logic circuit 100 is said to be configurable, as the configuration data set "configures" the logic circuit to perform a particular function, and this configuration data set can be modified by writing new data in the SRAM cells.

FIG. 2 illustrates an example of a configurable interconnect circuit 200. This interconnect circuit 200 connects a set of input data 205 to a set of output data 210. This circuit receives configuration data bits 215 that are stored in a set of SRAM cells 220. The configuration bits specify how the interconnect circuit should connect the input data set to the output data set. The interconnect circuit 200 is said to be configurable, as the configuration data set "configures" the interconnect circuit to use a particular connection scheme that connects the input data set to the output data set in a desired manner. Moreover, this configuration data set can be modified by writing new data in the SRAM cells.

FIG. 3 illustrates one example of the interconnect circuit 200. This example is a 4-to-1 multiplexer 300. Based on the configuration bits 215 that this multiplexer receives, the multiplexer 300 passes one of its four inputs 205 to its output 305. FIG. 4 illustrates a decoder 400, which is another example of the interconnect circuit 200. Based on the configuration bits 215 that this decoder receives, the decoder 400 passes its one input 405 to one or more of its outputs 210, while having the outputs that are not connected to the input at a constant value (e.g., ground or VDD) or at a high impedance state.

FPGA's have become popular as their configurable logic and interconnect circuits allow the FPGA's to be adaptively configured by system manufacturers for their particular applications. Also, in recent years, several configurable IC's have been suggested that are capable of reconfiguration at runtime. However, there has not been much innovation regarding IC's that can configure one or more times during one clock cycle. Consequently, most reconfigurable IC's take several cycles (e.g., tens, hundreds, or thousands of cycles) to reconfigure.

Recently, some have suggested a new type of configurable IC that is called a via programmable gate array ("VPGA"). U.S. Pat. No. 6,633,182 ("the '182 patent") discloses such configurable circuits. This patent defines a VPGA as a configurable IC similar to an FPGA except that in a VPGA the programmability is provided by modifying the placement of vias rather than modifying data bits stored in a memory. As further stated in this patent, in the interconnect structure of a VPGA, the programmable interconnect point is a single via, which replaces several transistors in an FPGA.

That is a need in the art for configurable IC's that use novel VPGA structures. There is also a need in the art for configurable IC's that can configure at least once during each clock cycle. Ideally, the configurable IC can configure multiple times within one clock cycle. Such configurability would have many advantages, such as enabling an IC to perform numerous functions within an given clock cycle.

SUMMARY OF THE INVENTION

Some embodiments of the invention provide a configurable integrated circuit (IC). The IC includes a logic circuit for receiving input data sets and configuration data sets and performing several functions on the input data sets. Each configuration data set specifies a particular function that the logic circuit has to perform input data set. The IC also includes a connection circuit for supplying sets of the configuration data to the logic circuit at a particular rate for at least a particular time period. At least two supplied configuration data sets are different and configure the logic circuit to perform two different functions on the input data.

BRIEF DESCRIPTION OF THE DRAWINGS

The novel features of the invention are set forth in the appended claims. However, for purpose of explanation, several embodiments of the invention are set forth in the following figures.

FIG. 3 illustrates one example of the interconnect circuit.

DETAILED DESCRIPTION OF THE INVENTION

In the following description, numerous details are set forth for purpose of explanation. However, one of ordinary skill in the art will realize that the invention may be practiced without the use of these specific details. For instance, not all embodiments of the invention need to be practiced with the specific number of bits and/or specific devices (e.g., multiplexers) referred to below. In other instances, well-known structures and devices are shown in block diagram form in order not to obscure the description of the invention with unnecessary detail.

I. Definitions

Some embodiments of the invention are circuit elements that can be configured within "sub-cycles" of a "design cycle" or an "interface cycle" of an IC. An IC typically has numerous clocks that are used to synchronize its operations. A clock typically has a number of repetitive cycles. A clock also has a period and a frequency (also called a rate). A clock's period is the temporal duration of one of its repetitive cycles, while its frequency (or rate) is the inverse of its period. For example, a clock with a 10 ns period has a frequency of 100 MHz.

The design clock rate (or frequency) of an IC or a portion of an IC is the clock rate for which the design of the IC or the portion of the IC has been specified. In some cases, the design clock rate is defined as one over the duration of time between the fastest, stable (i.e., non-transient) change in a state of the design (e.g., the fastest change in an output of the design). When the design is a Register Transfer Level (RTL) design, the design clock rate can be the clock rate for which the user specifies his or her design in a hardware definition language (HDL), such as VHDL or Verilog.

Figure 5:
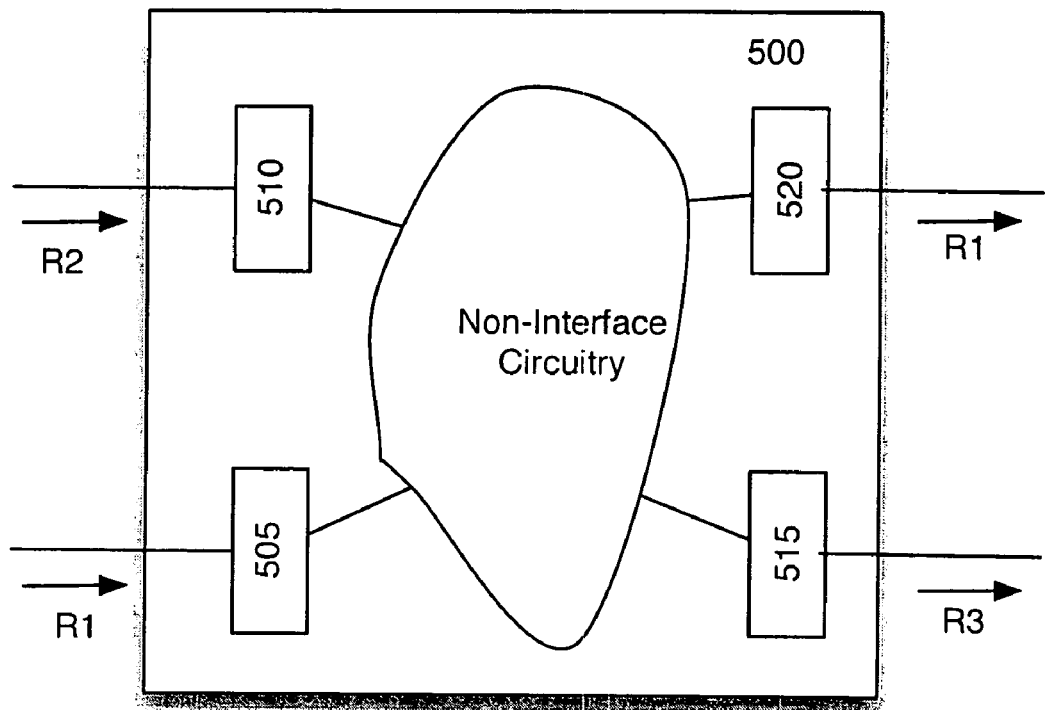
FIGS. 5 and 6 present two examples of interface circuits of IC's.
Figure 6:
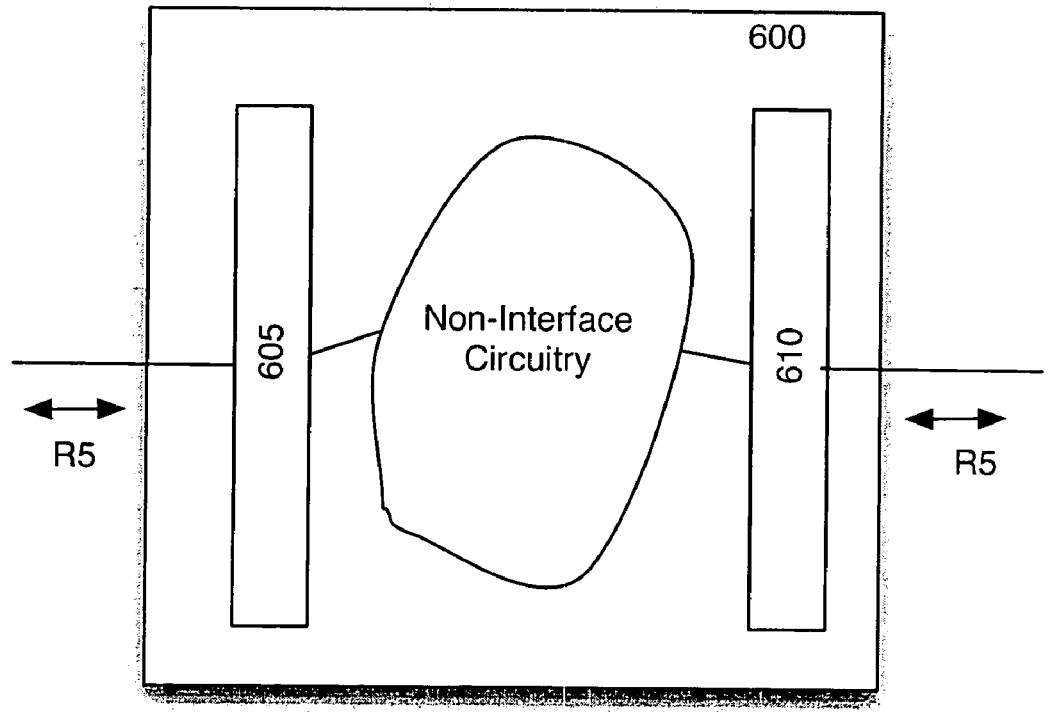

An interface rate of an IC is the rate at which the IC communicates with other circuitry. For instance, in some cases, an IC's interface rate is the rate that an interface circuit of the IC passes signals to and/or receives signals from circuits outside of the IC. An IC can have one or more interface circuits, and these interface circuits can have the same or different interface rates. FIGS. 5 and 6 present two examples of interface circuits. FIG. 5 illustrates an IC 500 that has four one-directional interface circuits 505, 510, 515, and 520 that operate at three different interface rates. Specifically, the interface circuit 505 receives input at a first rate R1, the interface circuit 510 receives input at a second rate R2, the interface circuit 515 provides output at a third rate R3, and the interface circuit 520 provides output at a first rate R1. FIG. 6 illustrates an IC 600 that has two bi-directional interface circuits 605 and 610 that operate at the same interface rate of R5.

An alternative term for an IC's interface rate is an input/output rate of the IC. An interface cycle is one over the interface rate, while a design cycle is one over the design rate. A sub-cycle of a design or interface cycle is a portion of the design or interface cycle. In the discussion of sub-cycle configurable circuits below, the term "primary cycle" refers to either a design cycle or an interface cycle. Similarly, the term "primary clock" refers to either a design clock or an interface clock.

In some embodiments, a primary cycle's period is broken into several sub-cycles of equal duration. For instance, a 10 ns cycle can be broken into 10 sub-cycles of 1 ns each. Some embodiments use sub-cycle signal generators that generate sub-cycle clocks and/or signals that have some relation with the primary clock but have faster rates than the primary clock. For instance, in some embodiments, the sub-cycle clocks and/or signals are derived from the primary clock. In some embodiments, the sub-cycle clocks and/or signals have rates that share a least common multiple with the rate of the primary clock. Also, in some embodiments, the sub-cycle clocks and/or signals are aligned with the primary clock on at least some of their edge transitions. In some of these embodiments, each sub-cycle that falls within a particular cycle of the primary clock is referred to as a "phase."

Figure 1:
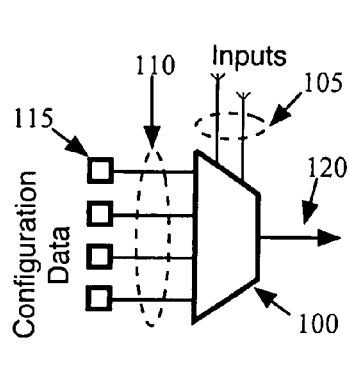
FIG. 1 illustrates an example of a configurable logic circuit.
Figure 2:
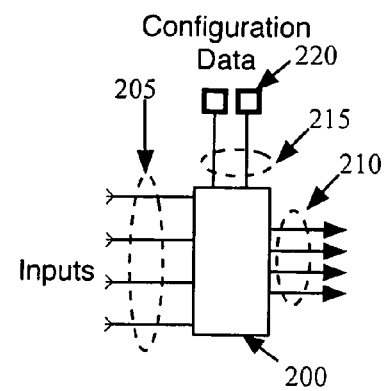
FIGS. 2-4 illustrate several example of configurable interconnect circuits.
Figure 3:
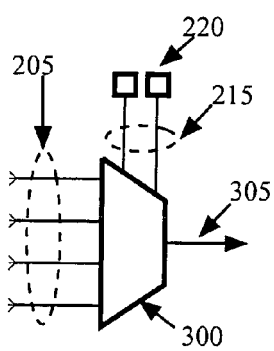
Figure 4:
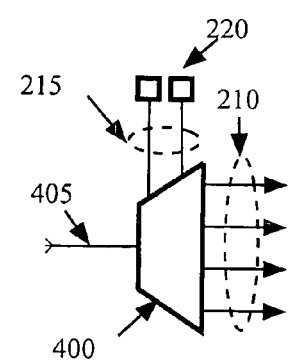
Figure 7:
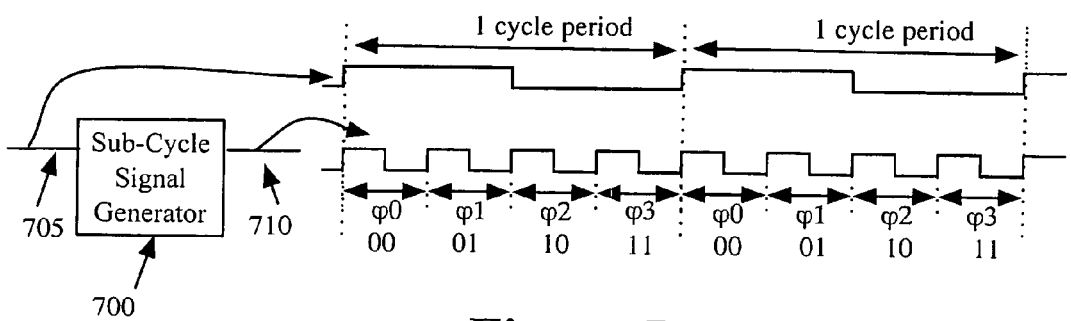
FIG. 7 illustrates an example of a sub-cycle signal generator.

FIG. 7 illustrates an example of a sub-cycle signal generator 700. This generator receives a primary clock 705 and generates a sub-cycle clock 710 that is four times faster than the received clock. Hence, as shown in FIG. 7, the sub-cycle clock has four phases $\phi0$, $\phi1$, $\phi2$, $\phi3$, during each cycle of the received clock. The sub-cycle signal generator can provide configurable circuit elements with its sub-cycle clock. In conjunction with this clock, or instead of this clock, the generator can provide configurable circuit elements with a signal whose value can change in each sub-cycle period. For instance, in FIG. 7, the sub-cycle signal generator 700 generates a 2-bit phase signal, with four different values 00, 01, 10, and 11. These four values represent the four sub-cycles during each primary cycle. In this figure, these generated phase signals change in each sub-cycle and reset at the start of each period of the received clock.

Although FIG. 7 shows these phase signals as changing sequentially, these phase signals change in a non-sequential manner in some embodiments. Also, in some embodiments, the order of the phase signals in each period of the received clock can differ, e.g., in one clock period the phase bits might appear as 00, 10, 11, 01, and in the next clock period the phase bits might appear as 11, 10, 01, 00. In some embodiments, the sub-cycle signal generator can generate phase signals that have different ordering in different primary cycles by generating the phase bits based not only on the primary clock signal but also on programming signals that it receives. Such programming signals programmably direct the sub-cycle signal generator to generate different phase signals at different times.

Moreover, in some or all primary cycles, the sub-cycle signal generator can generate a phase signal that does not utilize all possible phase bit permutations or that utilizes one or more of the phase bit permutations more than once during a primary cycle. Furthermore, the sub-cycle signal generator might use different encoding schemes (e.g., a Gray code encoding scheme, a one-hot encoding scheme, etc.) to generate its phase signals. Also, a primary cycle might be divided into more or fewer than four sub-cycles.

Some embodiments of the invention are IC's with sub-cycle configurable logic and interconnect circuits. As further described below, a configurable logic circuit is a circuit that can be configured to perform a set of functions on a set of input data that it receives. The logic circuit receives a set of configuration data that cause the logic circuit to perform a particular function within its set of functions on the input data set. The logic circuit then outputs the result of this function as a set of output data. A logic circuit is sub-cycle configurable if the logic circuit can be configured one or more times within one primary cycle to perform more than one function. In other words, such a logic circuit can be reconfigured one or more times in a primary cycle. In some of the embodiments described below, the sub-cycle configurable logic circuits can be reconfigured to perform a new function within each sub-cycle of a primary cycle.

A configurable interconnect circuit is a circuit that can configurably connect an input set to an output set in a variety of manners. An interconnect circuit receives a configuration data set that causes the interconnect circuit to connect its input set to its output set in a particular manner. An interconnect circuit is sub-cycle configurable if it can be configured one or more times within one primary cycle to change the way it connects the input and output sets. In other words, a sub-cycle configurable interconnect circuit is a configurable interconnect circuit that can be reconfigured one or more times within a primary cycle. In some of the embodiments described below, a sub-cycle configurable interconnect circuit can be reconfigured within each sub-cycle of a primary cycle to change its connection scheme.

Examples of sub-cycle configurable logic and interconnect circuits will be provided below in Sections III-VI below. However, before providing these examples, the benefit of sub-cycle reconfiguration will be first described in Section II.

II. Sub-Cycle Configuration

Figure 8:
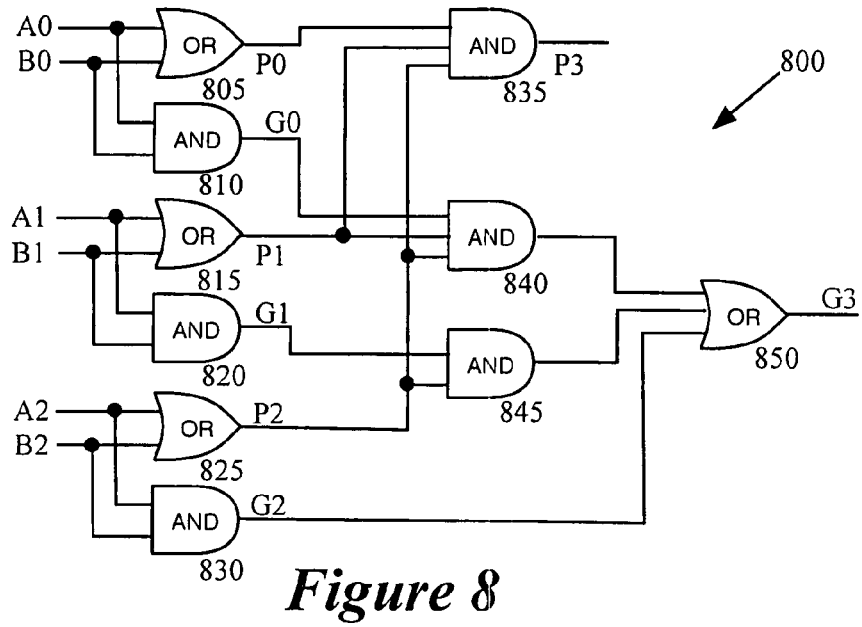
FIGS. 8-10 present an example that illustrates how a larger, slower IC design can be implemented by a smaller, faster IC design.
Figure 9:
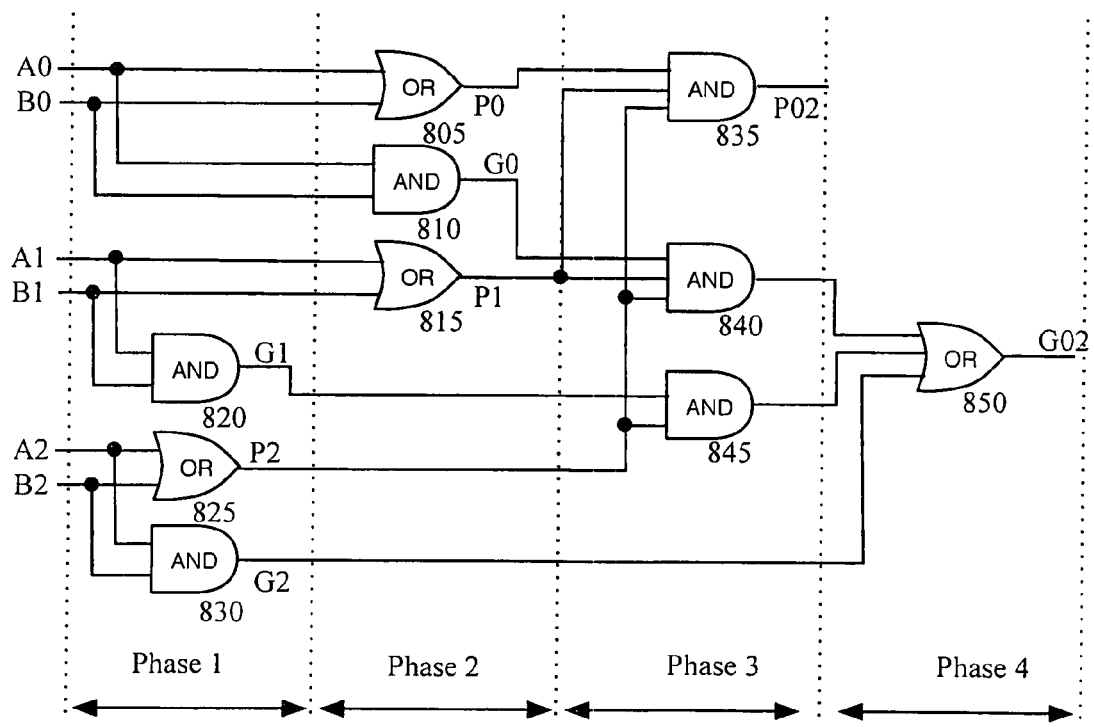
Figure 10:
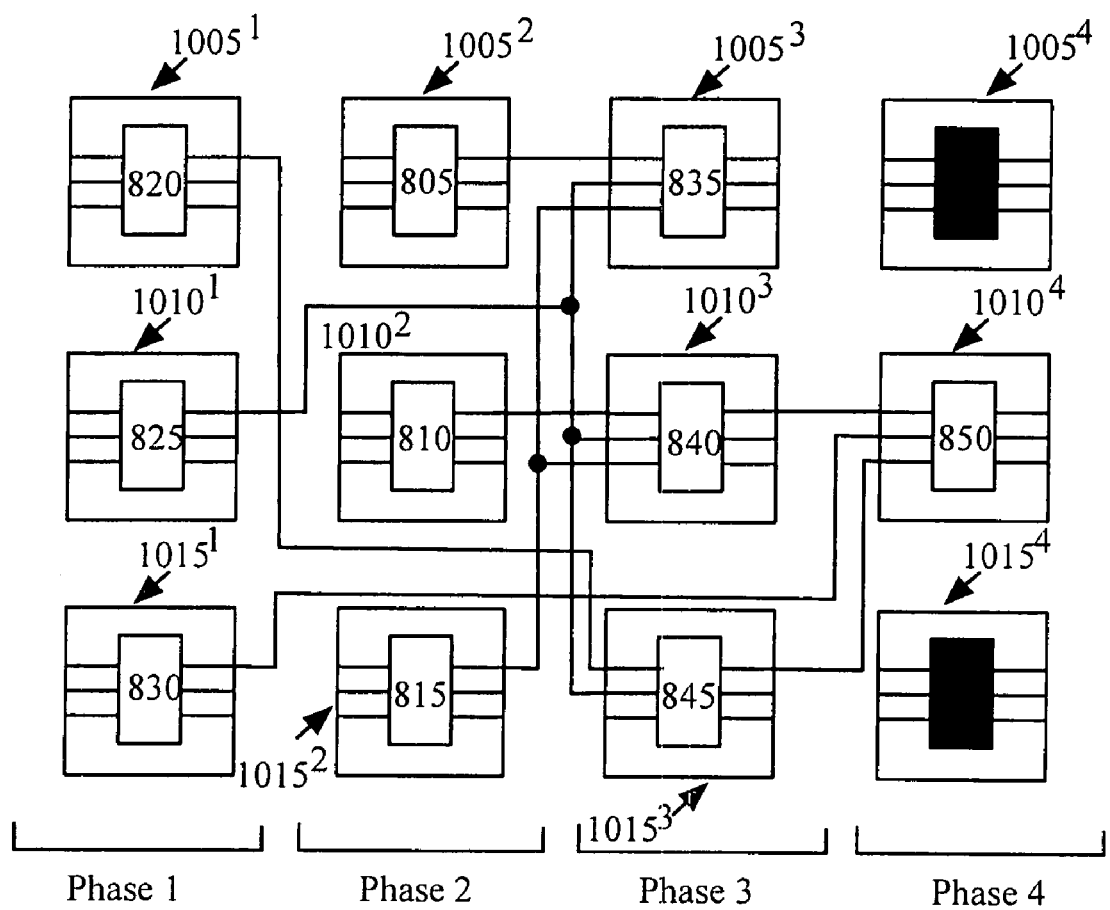

Sub-cycle configurability has many advantages. One advantage is that it allows a larger, slower IC design to be implemented by a smaller, faster IC design. FIGS. 8-10 present an example that illustrates this benefit. FIG. 8 illustrates a set of Boolean gates that compute two functions G3 and P3 based on a set of inputs A0, B0, A1, B1, A2, and B2. The set of Boolean gates has to compute these two functions based on the received input set in one design cycle. In this example, one design cycle lasts 10 ns, as the design clock's frequency is 100 MHz. However, in this example, the technology could easily operate at 400 MHz. Hence, each design cycle can be broken down into 4 sub-cycles of 2.5 ns duration.

FIG. 9 illustrates the design 800 of FIG. 8 after its gates have been placed into four groups. These gates have been placed into four groups in order to break down the design 800 into four separate groups of gates that can be configured and executed in four sub-cycles by a smaller group of gates. The groupings illustrated in FIG. 9 are designed to separate out the computation of different sets of gates while respecting the operational dependencies of other gates. For instance, gates 805, 810, and 815 are defined as a separate group from gates 820, 825, and 830, as these two sets of gates have no operational dependencies (i.e., the output of the gates in one set is not dependent on the output of the gates in the other set). As these two sets of gates have no operational dependencies, one set is selected for computation during the first sub-cycle (i.e., during phase 1), while the other set is selected for computation during the second sub-cycle (i.e., during phase 2). On the other hand, gates 835, 840, and 845 are dependent on the outputs of the first two sets of gates. Hence, they are designated for configuration and execution during the third sub-cycle (i.e., during phase 3). Finally, the gate 850 is dependent on the output of the first and third sets of gates, and thus it is designated for configuration and execution during the fourth sub-cycle (i.e., during phase 4).

FIG. 10 illustrates another representation of the design 800 of FIG. 8. Like FIG. 9, the schematic in FIG. 10 illustrates four phases of operation. However, now, each gate in the design 800 has been replaced by a sub-cycle configurable logic circuit 1005, 1010, or 1015. Also, only three logic circuits 1005, 1010, and 1015 are used in FIG. 10, as each of the gates in FIG. 8 can be implemented by one logic circuit, and the groupings illustrated in FIGS. 9 and 10 require at most 3 gates to be executing during any given phase. (In FIG. 10, each logic circuit's operation during a particular phase is identified by a superscript; so, for example, reference numbers $1005^1$, $1005^2$, and $1005^3$, respectively, identify the operation of the logic circuit 1005 during phases 1, 2, and 3.)

As shown in FIG. 10, the outputs of certain logic circuits in earlier phases need to be supplied to logic circuit operations in the later phases. One of ordinary skill will realize that such earlier outputs can be preserved for later computations by using state elements (such as registers) that are operated at the sub-cycle frequency. Such state elements (not shown) can be standalone circuit elements or can part of one or more sub-cycle configurable interconnect circuits (not shown) that are configured to connect the logic circuits in the desired manner.

Accordingly, FIGS. 8-10 illustrate that sub-cycle configurability allows a ten-gate design that operates at 100 MHz to be implemented by three sub-cycle configurable logic circuits and associated configurable interconnect circuits and state elements that operate at 400 MHz. It should be noted that even fewer than three logic circuits might be necessary if one logic gate can perform the operation of two or more gates that are executing during each phase illustrated in FIG. 9.

III. Sub-Cycle Configurable Logic Circuit

Figure 11:
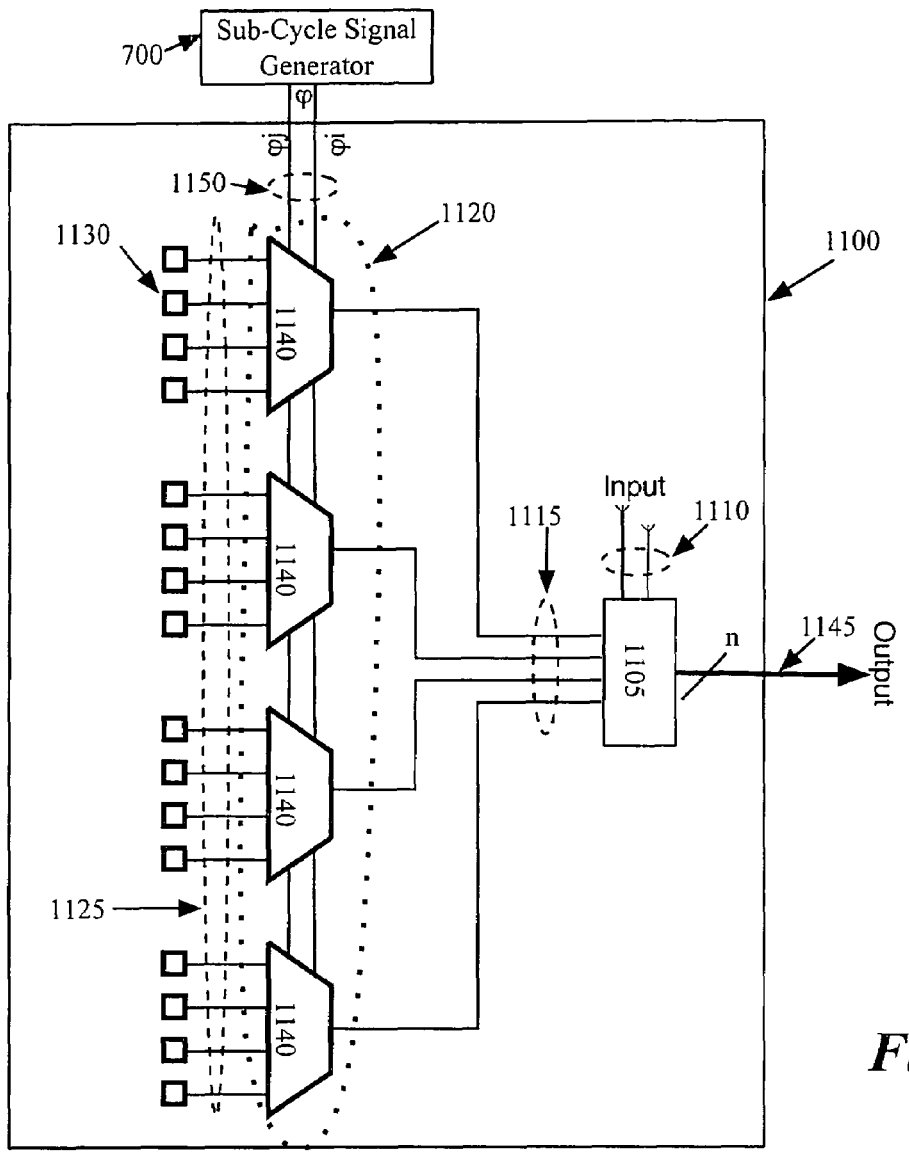
FIG. 11 illustrates a sub-cycle configurable logic circuit of some embodiments of the invention.

FIG. 11 illustrates a sub-cycle configurable logic circuit 1100 of some embodiments of the invention. This logic circuit includes a core logic circuit 1105 that can perform a variety of functions on a set of input data 1110 that it receives. The core logic circuit 1105 also receives a set of four configuration data bits 1115 through a switching circuit 1120.

The switching circuit receives a larger set of sixteen configuration data bits 1125 that, in some embodiments, are stored in a set of memory cells 1130 (e.g., SRAM cells). This switching circuit is controlled by a phase φ, which is generated by the above-described sub-cycle signal generator 700.

As described above and illustrated in FIG. 7, the generator 700 in some embodiments generates a phase signal that is a 2-bit phase signal, which has a value that changes sequentially during each sub-cycle period and resets at the start of each primary cycle period. However, in other embodiments, the sub-cycle signal generator 700 generates a phase signal in other sequential or non-sequential manners with different ordering and/or encoding schemes.

During each phase (i.e., each sub-cycle), the switching circuit supplies four configuration data bits 1115 to the logic circuit 1105. In some embodiments, the switching circuit is a set of four multiplexers 1140. A multiplexer is any device that can select k-of-n signals, where k and n are any integer values. Multiplexers include pass transistors, sets of tri-stated buffers or transistors, or any device that can select k-of-n signals. During each sub-cycle, each multiplexer 1140 supplies one of four configuration bits that it receives to the logic circuit 1105. One of ordinary skill will realize that other switching circuits and sub-cycle generators can be used in other embodiments of the invention.

Based on the set of configuration data 1115, the logic circuit 1105 performs on the input data set 1110 a particular function from the set of functions that it can perform. As the switching circuit 1120 can supply different configuration data sets 1115 to the logic circuit 1105 during different sub-cycles, the logic circuit 1105 can be configured to perform different functions on the input data set 1110 during different sub-cycles.

The core logic circuit 1105 has a set of n output lines 1145, where n is an integer. This circuit provides the result of performing its configured function on the input data set 1110 along its output lines 1145. These output lines provide the output of the overall logic circuit 1100.

The core logic circuit 1105 is different in different embodiments of the invention. In some cases, a logic circuit 1105 is nothing more than a switching circuit that routes one or more of the input data bits to one or more of the output lines based on the value of the configuration data. However, in other cases, the logic circuit 1105 does not simply route a selection or a permutation of the input data set to the output data set but rather performs computations on the input data set to derive the output data set.

Figure 12:
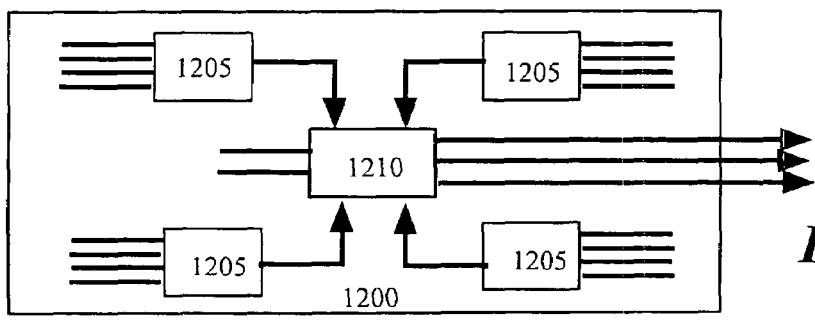
FIG. 12 illustrates a complex logic circuit that is formed by four LUT's and an interconnect circuit.

Any number of known logic circuits (also called logic blocks) can be used in conjunction with the invention. Examples of such known logic circuits include look-up tables (LUT's), universal logic modules (ULM's), sub-ULM's, multiplexers, and PAL/PLA. Also, logic circuits can be complex logic circuit formed by multiple logic and interconnect circuits. For instance, FIG. 12 illustrates a complex logic circuit 1200 that is formed by four LUT's 1205 and an interconnect circuit 1210. One of ordinary skill will realize that the illustration of the logic circuit 1200 is a simplification that does not show several circuit elements (e.g., fast-carry logic, etc.) that are commonly in complex logic circuits. This illustration is provided only to convey the principle that more complex logic circuits are often formed by combining simpler logic circuits and interconnect circuits. Examples of simple and complex logic circuits can be found Architecture and CAD for Deep-Submicron FPGAs, Betz, et al., ISBN 0792384601, 1999.

Figure 13:
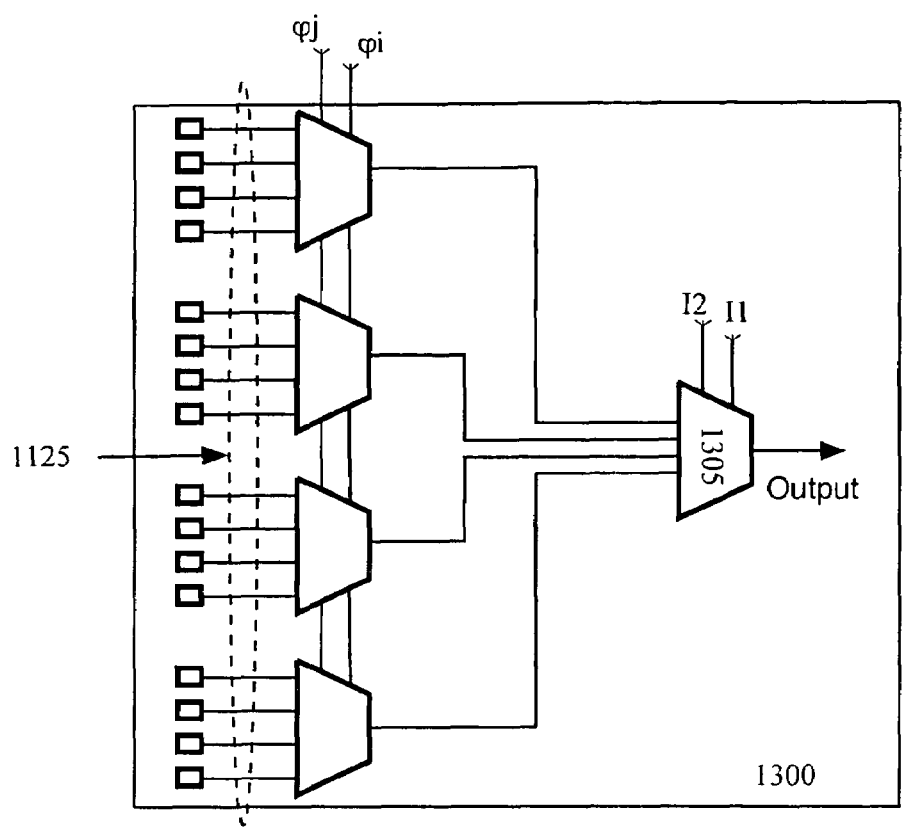
FIGS. 13-15 illustrate three logic circuits that are three examples of the logic circuit of FIG. 11.
Figure 14:
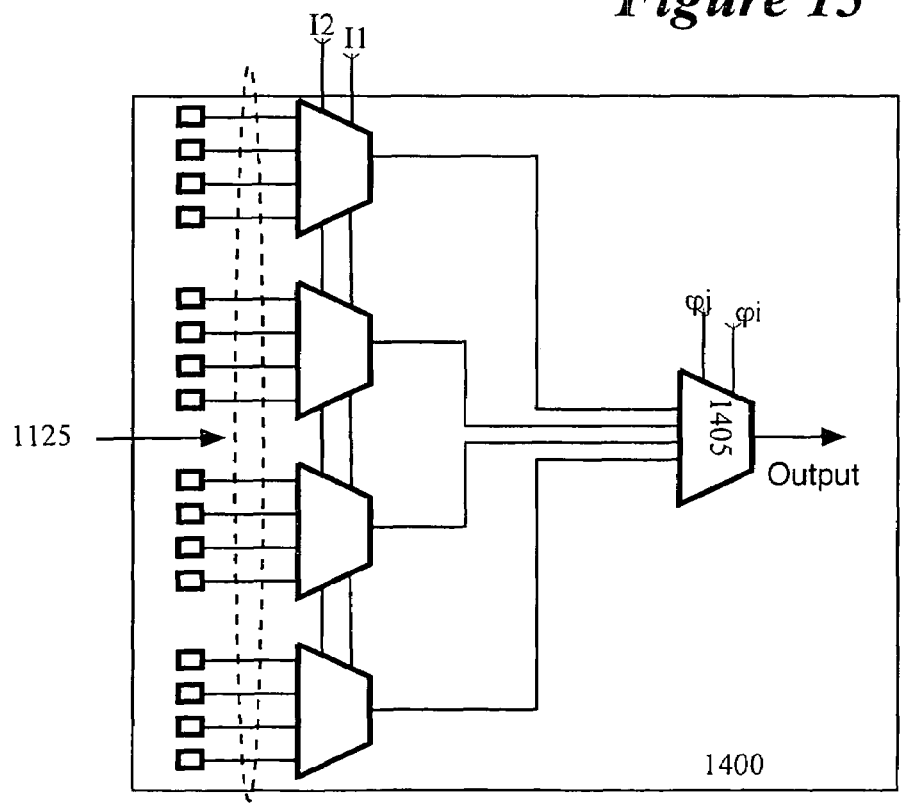
Figure 15:
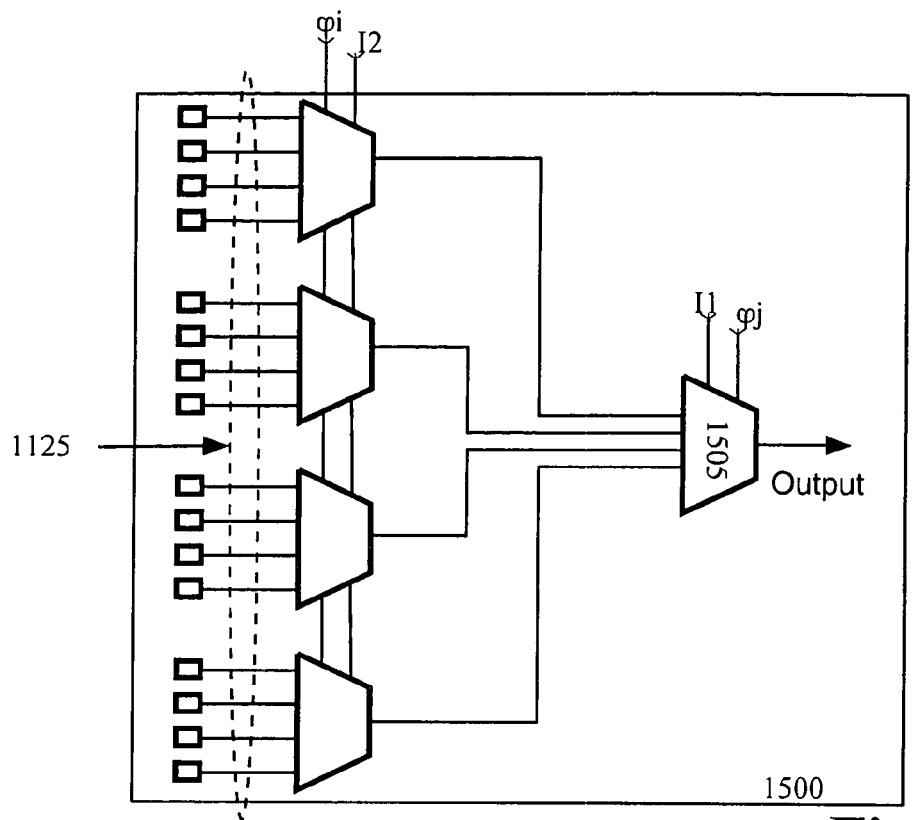

FIGS. 13-15 illustrate three logic circuits 1300, 1400, and 1500, which are three examples of the logic circuit 1100. In these three examples, the core logic circuits 1305, 1405, and 1505 (which are one implementation of the core logic circuit 1105 of FIG. 11) are multiplexers. The logic circuits 1300, 1400, and 1500 are all commutative with respect to the ordering of the input data set 1110 and the sub-cycle signals 1150. Specifically, labeling the two input signals as I1 and I2 and the two sub-cycle signals as φi and φj, the logic circuits 1300, 1400, and 1500 all provides the same output for the same configuration data set 1125, even though the ordering of the sub-cycle signals and the input data sets is different in these three examples.

Figure 16:
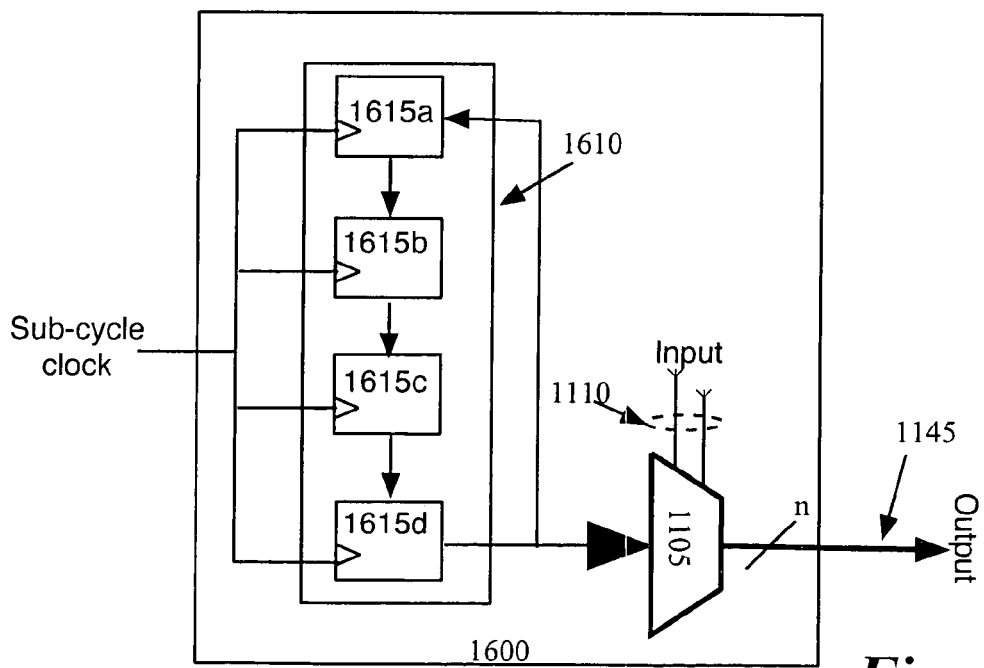
FIG. 16 illustrates a logic circuit of another embodiment of the invention.

FIG. 16 illustrates another embodiment of the invention. This embodiment is a logic circuit 1600 that, like the logic circuit 1100 of FIG. 11, can be reconfigured in each sub-cycle. However, unlike the logic circuit 1100 that can be configured in a non-sequential manner when the sub-cycle signal generator 700 provides a non-sequential signal, the logic circuit 1600 is only configured in a sequential manner. Specifically, the logic circuit 1600 has a core logic circuit 1105 and a sequential circuit 1610. The sequential circuit 1610 provides the core logic circuit 1105 with a configuration data set in each sub-cycle. In this example, four shift registers 1615 form the sequential circuit 1610. Each shift register stores one configuration data set. At the start of each sub-cycle period, the shift registers pass their content (i.e., their configuration data bits) to each other in a counterclockwise manner as illustrated in FIG. 16 (i.e., 1615*a* passes its content to 1615*b*, 1615*b* passes its content to 1615*c*, 1615*c* passes its content to 1615*d*, and 1615*d* passes its content to 1615*a*). Also, at the start of each sub-cycle period, the configuration data set in the register 1615*d* is supplied to the logic circuit 1105.

Based on the set of configuration data that it receives, the logic circuit 1105 selects, from the set of functions that it can perform, a particular function to perform on its input data set 1110. As the sequential circuit 1610 can supply different configuration data sets to the logic circuit 1105 during different sub-cycles, the logic circuit 1105 can be configured to perform different functions on the input data set during different sub-cycles. The core logic circuit 1105 provides its output (i.e., provides the result of performing the configured function on the input data set 1110) along its set of n output lines 1145.

IV. Sub-Cycle Configurable Interconnect

Figure 17:
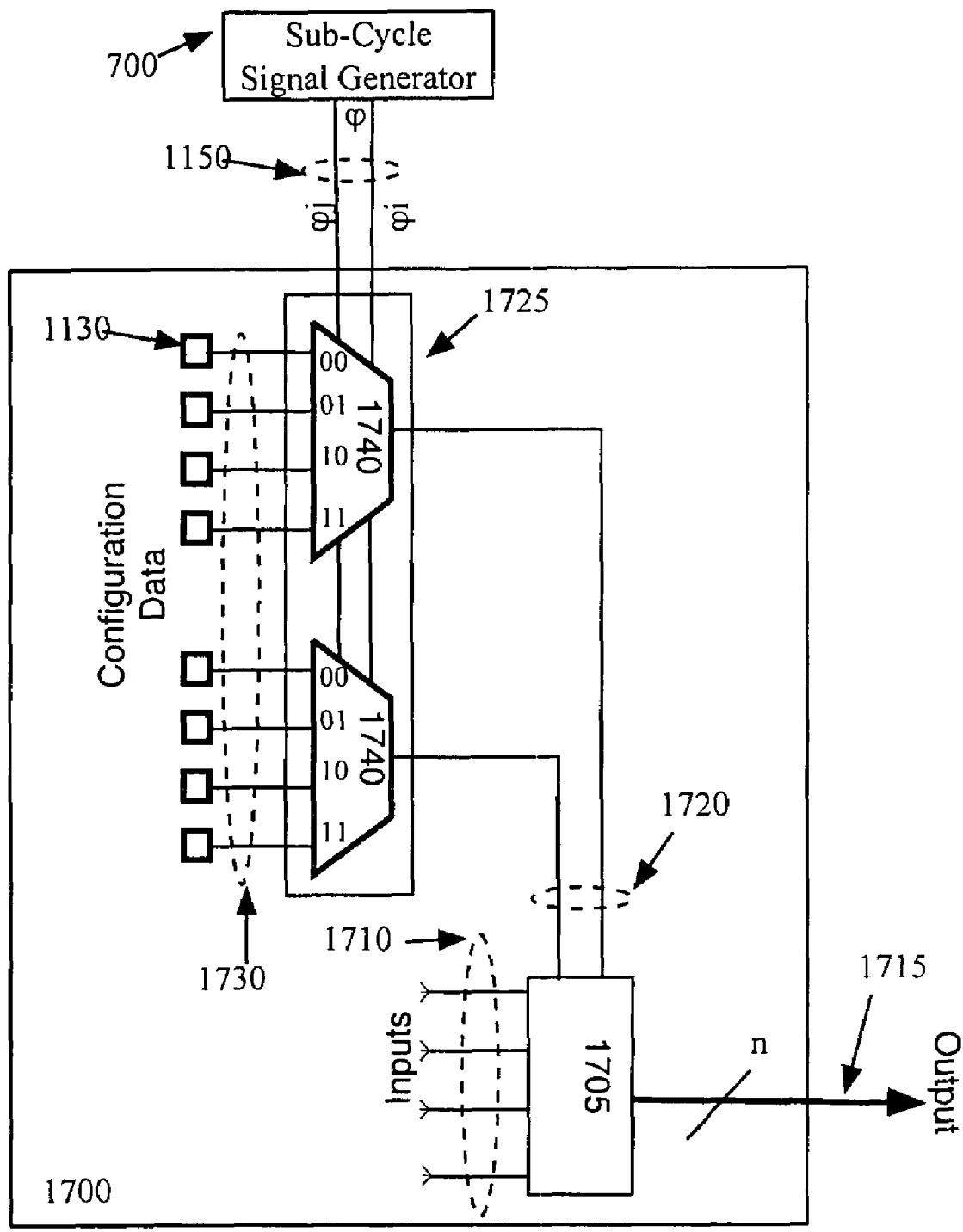
FIG. 17 illustrates a sub-cycle configurable interconnect circuit of some embodiments of the invention.

FIG. 17 illustrates a sub-cycle configurable interconnect circuit 1700 of some embodiments of the invention. This circuit configurably connects a set of input data terminals 1710 to a set of output data terminals 1715 based on a set of configuration data 1720. This interconnect circuit includes a core interconnect circuit 1705 that receives an input data set along the input data terminals 1710 and provides an output data set along the output data terminals 1715. The core interconnect circuit 1705 also receives the configuration data set 1720 through a switching circuit 1725. The switching circuit receives a larger set of configuration data bits 1730 that, in some embodiments, are stored in a set of memory cells 1130 (e.g., SRAM cells). This switching circuit is controlled by a phase φ, which is generated by the sub-cycle signal generator 700.

As described above and illustrated in FIG. 7, the generator 700 in some embodiments generates a phase signal that is a 2-bit phase signal, which has a value that changes sequentially during each sub-cycle period and resets at the start of each primary cycle period. However, in other embodiments, the sub-cycle signal generator 700 generates a phase signal in other sequential or non-sequential manners, with different ordering and/or encoding schemes.

During each phase (i.e., each sub-cycle), the switching circuit 1725 supplies two of the eight configuration data bits 1730 as the configuration data set 1720 to the interconnect circuit 1705. In FIG. 17, two multiplexers 1740 form the switching circuit. During each sub-cycle, each multiplexer 1740 supplies one of four configuration bits that it receives to the interconnect circuit 1705. In FIG. 17, a two-bit phase value is written next to each configuration bit that is received by each switching multiplexer 1740. These two-bit values identify the configuration bit associated with each pair of phase bits. One of ordinary skill will realize that other switching circuits and/or sub-cycle signal generators can be used in other embodiments of the invention.

Based on the set of configuration data 1720 that it receives, the interconnect circuit 1705 connects the input terminal set 1710 to the output terminal set 1715. As the switching circuit 1725 can supply different configuration data sets 1720 to the interconnect circuit 1705 during different sub-cycles, the interconnect circuit 1705 can differently connect the input terminal set 1710 to the output terminal set 1715 during different sub-cycles. The output terminal set 1715 provides the output of the overall interconnect circuit 1700 in some embodiments.

The core interconnect circuit is different in different embodiments of the invention. Any number of known interconnect circuits (also called interconnects or programmable interconnects) can be used in conjunction with the invention. Examples of such interconnect circuits include switch boxes, connection boxes, switching or routing matrices, full- or partial-cross bars, etc. Such interconnects can be implemented using a variety of known techniques and structures. Examples of interconnect circuits can be found Architecture and CAD for Deep-Submicron FPGAs, Betz, et al., ISBN 0792384601, 1999.

As shown in FIG. 17, the input terminal set 1710 is a first set of lines, while the output terminal set 1715 is a second set of lines. The second set of lines might be collinear with the first set of lines, or might be in a direction that is offset (e.g., is at 90°) from the first set of lines. Alternatively, some of the second set of output lines might be collinear with some of the first set of input lines, while other second-set lines might be at an angle with respect to some of the first-set lines.

In some embodiments, the interconnect circuit 1700 is bi-directional. Specifically, in these embodiments, the interconnect circuit can use some or all of the terminal set 1710 to receive input data signals during some sub-cycles, while using the same terminals to supply output data signals during other sub-cycles. Similarly, in these embodiments, the interconnect circuit can use some or all of the terminal set 1715 to supply output data signals during some sub-cycles, while using the same terminals to receive input data signals during other sub-cycles.

Although the interconnect circuit 1700 is shown as a sub-cycle configurable interconnect circuit in FIG. 17, this circuit 1700 is not sub-cycle configurable in other embodiments of the invention. In these other embodiments, in place of the phase signal $\phi$ 1150, this circuit receives a control signal whenever a new configuration data set needs to be supplied to the core interconnect circuit 1705. In some embodiments, this control signal has a frequency that is as fast as or faster than the primary clock rate. In other embodiments, this control signal's rate is slower than the primary clock rate. Alternatively, the control signal might not have any predictable rate.

Figure 18:
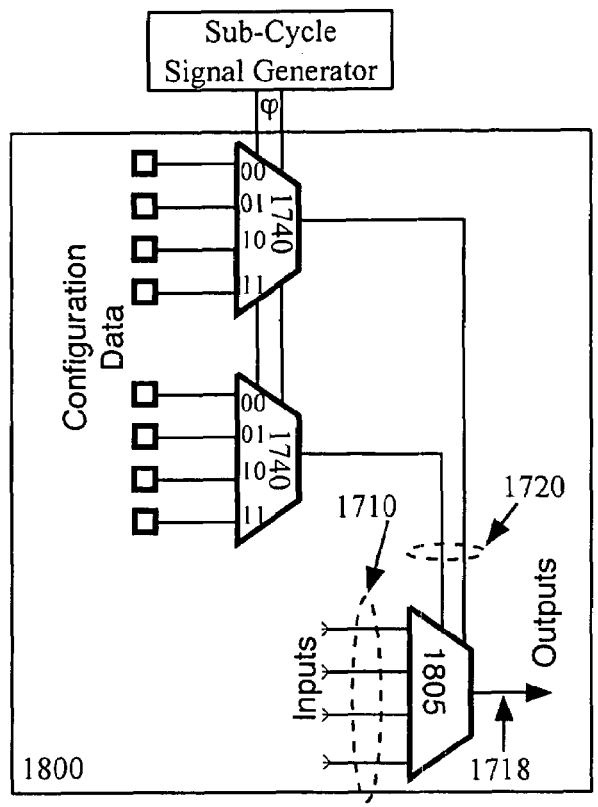
FIGS. 18 and 19 illustrate two examples of the interconnect circuit of FIG. 17.
Figure 19:
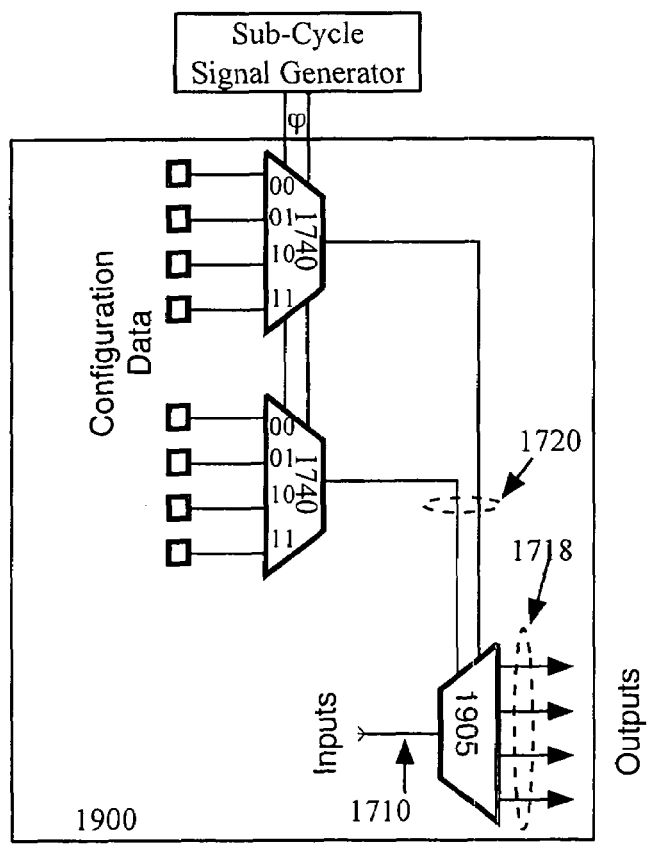

FIGS. 18 and 19 illustrate two examples 1800 and 1900 of interconnect circuit 1700. In FIG. 18, the core interconnect circuit 1805 is a 4-to-1 multiplexer that connects during any given sub-cycle one of its four input lines 1710 to its one output line 1718, based on the configuration data set 1720 that the multiplexer receives along its select lines. By having the ability to change the configuration data set 1720 during each sub-cycle, the multiplexer 1805 can be configured to connect a different input line to its output line during each sub-cycle.

In FIG. 19, the core interconnect circuit 1905 is a 1-to-4 decoder. Based on the configuration data set 1720 that it receives along its configuration lines, this decoder connects during any given sub-cycle its input line 1710 to one or more of its output lines 1715, while having the outputs that are not connected to the input set at a constant value (e.g., ground or VDD) or to a high impedance state. By having the ability to change the configuration data set 1720 during each sub-cycle, the decoder 1905 can be configured to connect a different set of output lines to its input line during each sub-cycle.

Figure 20:
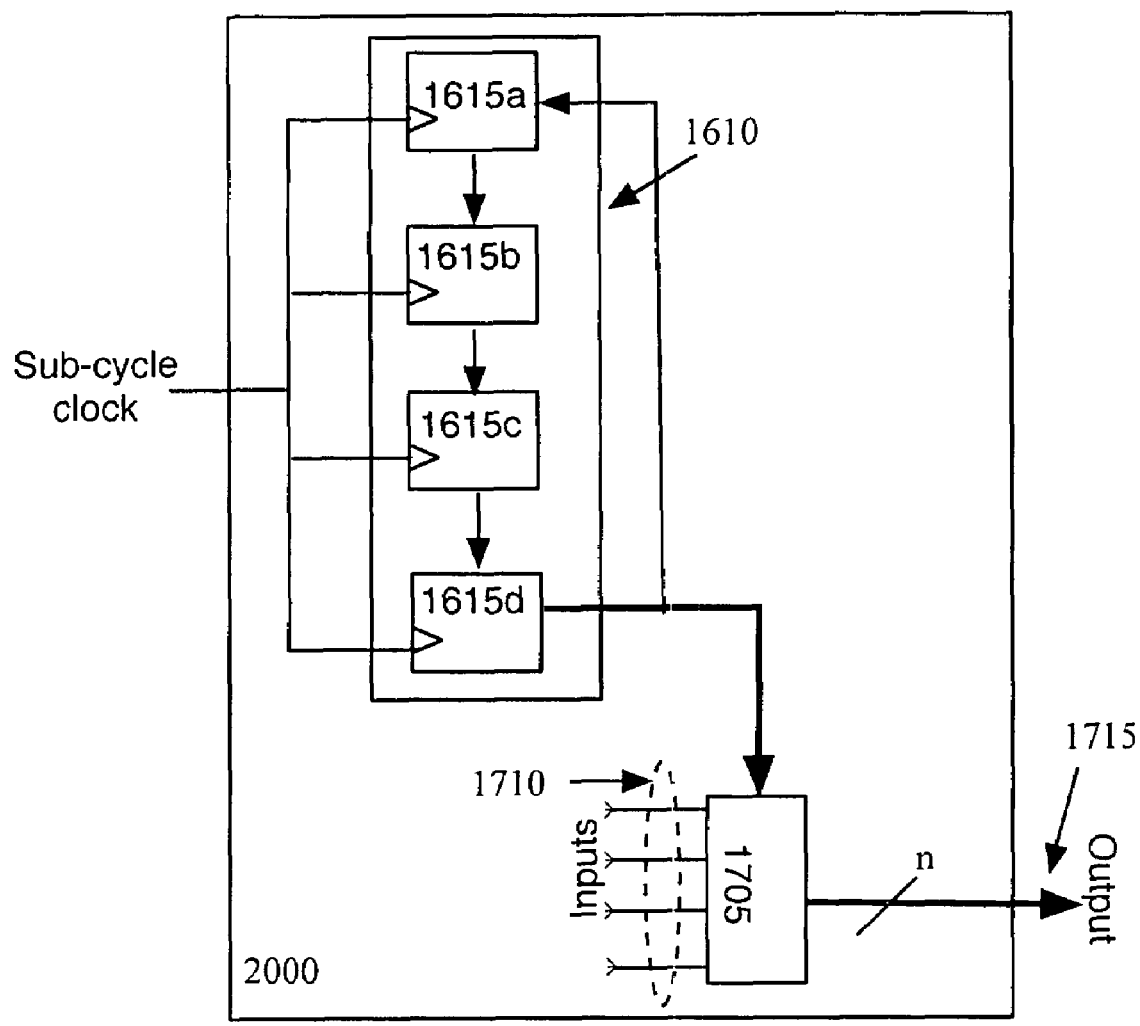
FIG. 20 illustrates the interconnect circuit of some embodiments of the invention.

FIG. 20 illustrates another embodiment of the invention. This embodiment is an interconnect circuit 2000 that, like the interconnect circuit 1700 of FIG. 17, can be reconfigured in each sub-cycle. However, unlike the interconnect circuit 1700 that can be configured in a non-sequential manner when the sub-cycle signal generator 700 provides a non-sequential signal, the interconnect circuit 2000 can only be configured in a sequential manner. Specifically, the interconnect circuit 2000 has a core interconnect circuit 1705 and a sequential circuit 1610. In this example, the sequential circuit 1610 is identical to the sequential circuit 1610 of FIG. 16. In other words, it is formed by four-shift registers 1615, where each shift register (1) stores one configuration data set during each sub-cycle and (2) passes its configuration data set to another shift register in a counterclockwise direction (that is shown in FIG. 20) at the start of each sub-cycle. Also, at the start of each sub-cycle period, the configuration data set in the register 1615d is supplied to the interconnect circuit 1705 of the circuit 2000.

The interconnect circuit 1705 then connects the input data set 1710 to the output data set 1715 based on the set of configuration data that this circuit receives. As the sequential circuit 1610 can supply different configuration data sets to the interconnect circuit 1705 during different sub-cycles, the interconnect circuit 1705 can be configured to connect the input and output data sets differently during different sub-cycles.

V. Configurable Interconnect Circuit with Via Programmable Structure

Sections V and VI describe several interconnect and logic circuits with via programmable structures. This description refers to vias, potential vias, via programmable arrays, and VPGA's. A via is connection between two wires (e.g., two conductive lines) on two different wiring layers. Vias can be defined in an IC in a variety of ways (e.g., by defining a cut between two layers, by defining two electrical structures or devices on two different layers that can establish an electrical connection at runtime, etc.) If the wires are on two layers that have one or more intervening wiring layers, the via might be formed as a set of stacked vias, where each via in the stack is between two adjacent layers.

A potential via is a site in an IC design for possibly defining a via. A via programmable array (VPA) is a set of vias or potential vias for a particular configurable interconnect or logic circuit. A configurable VPA interconnect or logic circuit is an interconnect or logic circuit that has an associated VPA. In some of the embodiments described below, configuration data for a configurable interconnect or logic circuit is provided to the circuit by defining certain vias in the circuit's associated VPA.

A. Structure

Figure 21:
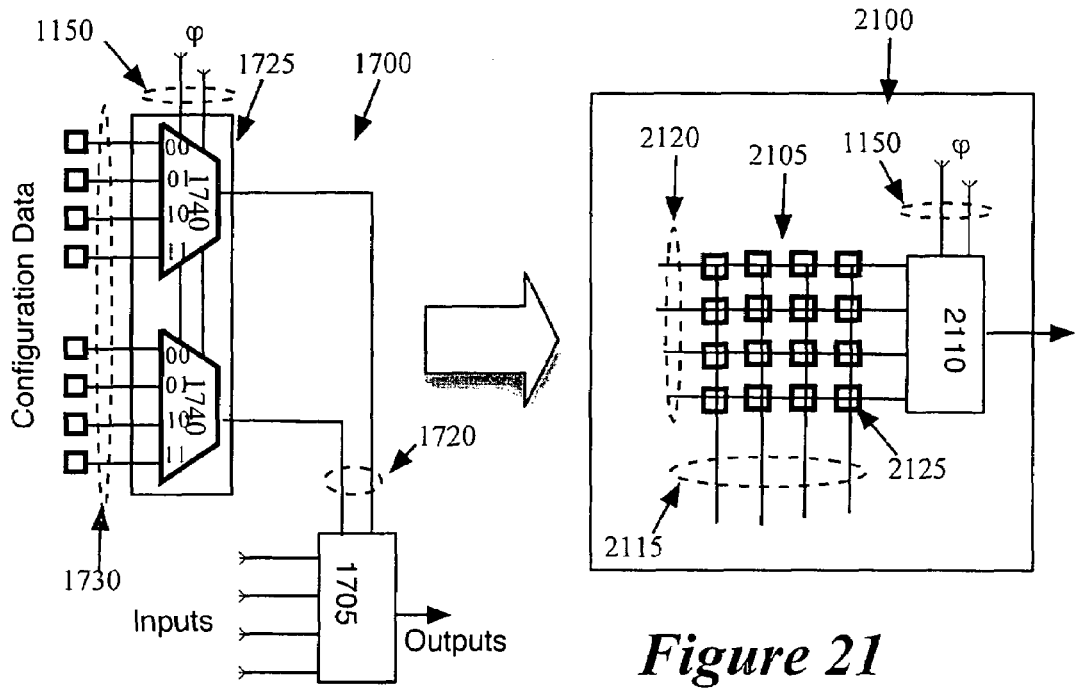
FIG. 21 illustrates a VPA interconnect circuit of some embodiments of the invention.

FIG. 21 illustrates an interconnect circuit 2100 of some embodiments of the invention. For a given phase signal 1150 and configuration data set 1730, the interconnect circuit 2100 can be used in place of the interconnect circuit 1700. The interconnect circuit 2100 includes a VPA 2105 and a core interconnect circuit 2110, which directly receives the phase signal 1150. The VPA structure 2105 is formed by two sets of lines that overlap. Typically, the two sets of lines appear on two different wiring layers of the IC, although these lines might appear on three or more layers in some embodiments. The first set is a set of input lines 2115, while the second set is a set of lines 2120 that are the inputs of the core logic circuit 2110. As shown in FIG. 21, each line in the first set overlaps each line in the second set at a 90° angle. In other embodiments, each line in the first set might not overlap every line in the second set, and/or each overlap might not be at a 90° angle.

As shown in FIG. 21, the VPA structure 2105 includes a potential via 2125 at each location where a line in the first set 2115 overlaps a line in the second set 2120. When the values of the phase signals 1150 and the configuration data set 1730 are known for the interconnect circuit 1700, certain vias in the array of potential vias can be set (i.e., defined) based on these values to complete the definition of the interconnect circuit 2100.

Figure 22:
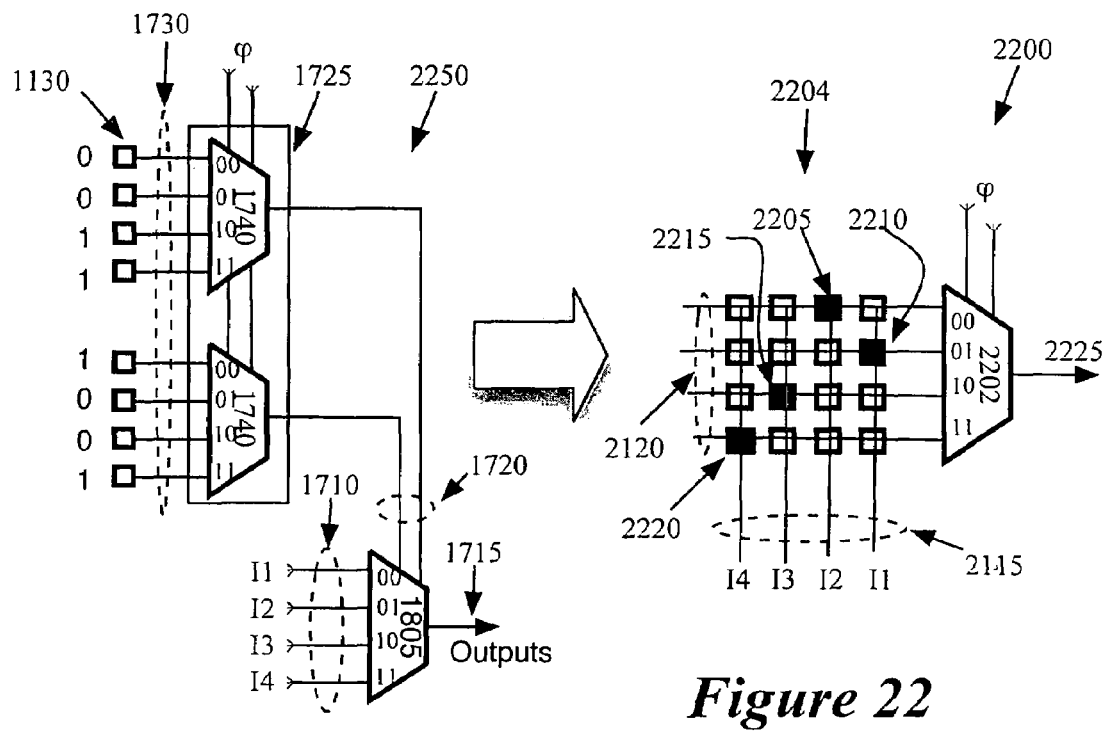
FIG. 22 presents an example that illustrates the setting of vias in a VPA structure of FIG. 21.

FIG. 22 presents an example that illustrates the setting of vias in a VPA structure 2204. Specifically, this example illustrates how a non-VPA interconnect circuit 2250 can be transformed into a sub-cycle configurable VPA interconnect circuit 2200. The non-VPA interconnect circuit 2250 is similar to the above described interconnect circuit 1805 of FIG. 18. Just like the interconnect circuit 1805, the interconnect circuit 2250 includes (1) a set of configuration storage elements 1130, (2) a switching circuit 1725 that is formed by two 4-to-1 multiplexers 1740, and (3) a core 4-to-1 multiplexer 1805.

The interconnect circuit 2200 includes a 4-to-1 multiplexer 2202 and a VPA 2204. The multiplexer 2202 and the VPA 2204 together subsume all the functionalities of the switching multiplexers 1740, configuration storage elements 1130, and 4-to-1 multiplexer 1805 of the interconnect circuit 2250, when the configuration data set 1730 has the values illustrated in FIG. 22 and the phase signal has values 00, 01, 10, and 11. In FIG. 22, a two-bit value is written next to each bit that is received by a 4-to-1 multiplexer 1740 to identify the bit associated with each received pair of bits. Similarly, a two-bit configuration value is written next to each input line that is received by the core multiplexer 1805 to identify the input line associated with each possible configuration data set.

At any given time, the 4-to-1 multiplexer 1805 connects one of its four input lines 1710 to its one output line 1715, based on the configuration data set 1720 that the multiplexer receives along its select lines. For the configuration data set 1730 illustrated in FIG. 22, the interconnect circuit 1805 receives 01, 00, 10, and 11 as the configuration data set 1720 as the phase signal φ cycles through the values 00, 01, 10, and 11. The phase signal φ does not need to proceed through the values 00, 01, 10, and 11 in any particular order or frequency. However, in some embodiments, this signal passes through these values in sequence and changes values in each sub-cycle.

Based on the configuration data set 1720 that it receives, the interconnect circuit 1805 connects one of its input lines to its output line 1715. Specifically, it connects its output line 1715 to (1) input I2 when the phase is 00 (as this circuit receives the configuration data 01 during this phase), (2) input I1 when the phase is 01 (as this circuit receives the configuration data 00 during this phase), (3) input I3 when the phase is 10 (as this circuit receives the configuration data 10 during this phase), and (4) input I4 when the phase is 11 (as this circuit receives the configuration data 11 during this phase).

In FIG. 22, the vias that are defined in the VPA structure 2204 are illustrated as black boxes. These defined vias allow the interconnect circuit 2200 to connect its input and output sets 2115 and 2225 in the same manner as the interconnect circuit 1805 in FIG. 22, for the phase signal values 00, 01, 10, and 11. Specifically, like the output line 1715 of the interconnect circuit 1805, the output line 2225 connects (1) to input line I2 through via 2205 during phase 00, (2) to input line I1 through via 2210 during phase 01, (3) to input line I3 through via 2215 during phase 10, and (4) to input line I4 through via 2220 during phase 11.

Figure 23:
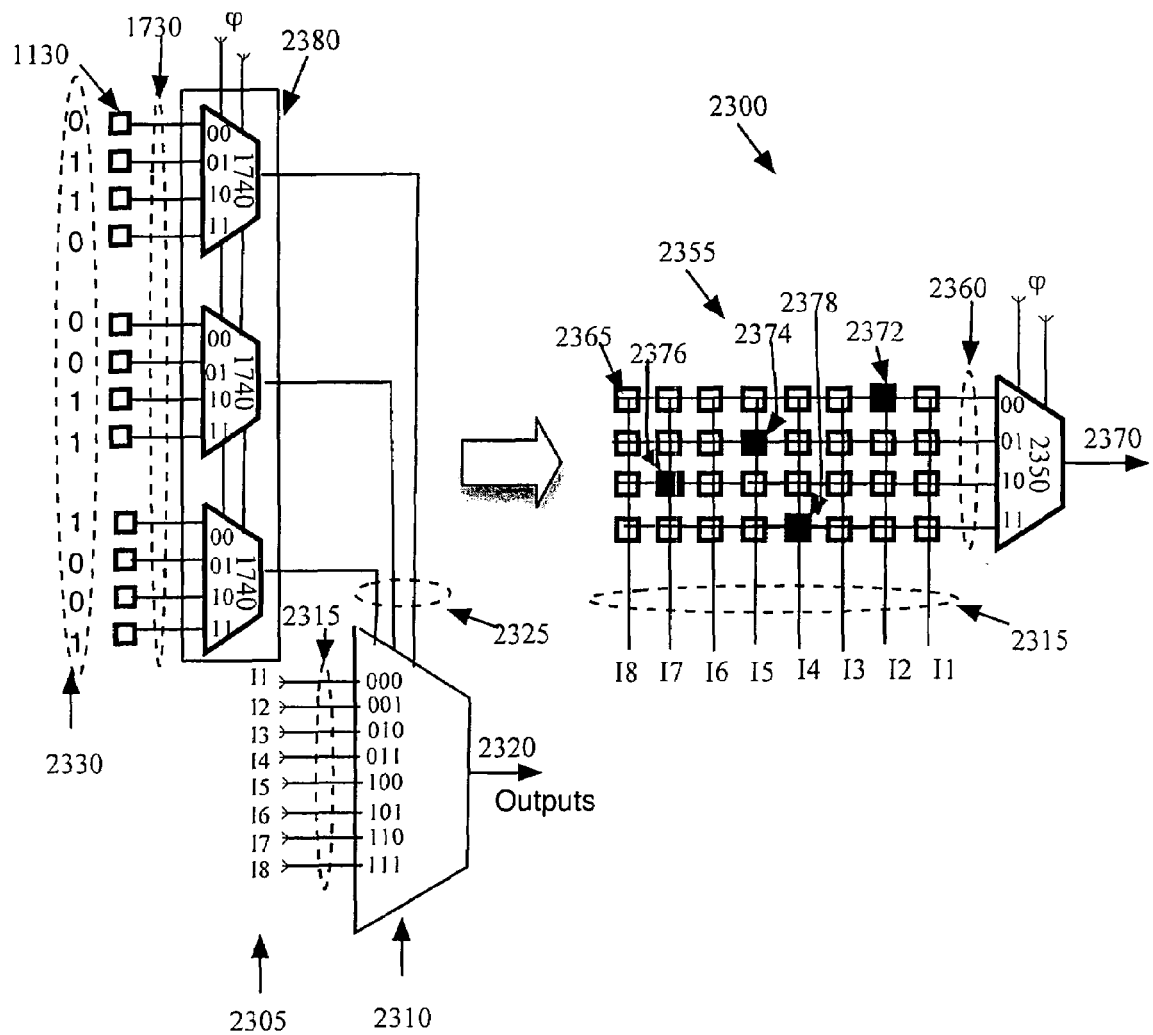
FIG. 23 illustrates another VPA interconnect circuit of some embodiments of the invention.

The migration from a non-VPA interconnect structure to a VPA interconnect structure not only eliminates the configuration bits and switching circuit, but it can also change the core interconnect circuit. FIG. 23 presents an example that more clearly illustrates this transformation. This figure illustrates a VPA interconnect circuit 2300 and a non-VPA interconnect circuit 2305 that are functionally equivalent for a given phase signal and configuration data set.

The non-VPA circuit 2305 is similar to the non-VPA interconnect circuit 2250 illustrated in FIG. 22, except that instead of the 4-to-1 multiplexer 1805 and two switching multiplexers 1740, it uses an 8-to-1 multiplexer 2310 and three switching multiplexers 1740. Each of the three switching multiplexers 1740 is controlled by the two-bit phase signal φ of the sub-cycle signal generator 700. As before, in some embodiments, this phase signal has the values 00, 01, 10, and 11, although it can have a different set of phases in other embodiments as described above. The three switching multiplexers act as a switching circuit 2380 that outputs four 3-bit configuration values during the four phases. (As before, the two-bit phase values are written next to each configuration bit that is received by each 4-to-1 multiplexer to show the configuration bit associated with each pair of phase bits.) The 8-to-1 multiplexer 2310 receives these 3-bit values 2325 on its select lines, and, based on each set of three values, connects one of its 8 inputs 2315 to its output 2320. (A three-bit configuration value is written next to each input line of the 8-to-1 multiplexer to show the input bit associated with possible configuration data set.)

For the configuration data set 2330 illustrated in FIG. 23, the multiplexer 2310 receives 001, 100, 110, and 011 as the configuration data set 2325, while the phase signal φ cycles through the values 00, 01, 10, and 11. As before, the phase signal φ does not need to proceed through all the values or through the values 00, 01, 10, and 11 in any particular order or frequency. However, in some embodiments, this signal passes through these values in sequence and changes values in each sub-cycle.

Based on the configuration data set 2325 that it receives, the interconnect circuit 2310 connects one of its input lines 2315 to its output line 2320. Specifically, it connects its output line 2320 to (1) input I2 when the phase is 00 (as this circuit receives the configuration data 001 during this phase), (2) input I5 when the phase is 01 (as this circuit receives the configuration data 100 during this phase), (3) input I7 when the phase is 10 (as this circuit receives the configuration data 110 during this phase), and (4) input I4 when the phase is 11 (as this circuit receives the configuration data 011 during this phase).

As mentioned above, the VPA interconnect circuit 2300 illustrated in FIG. 23 is equivalent to the non-VPA interconnect circuit 2305 for the configuration data set and phase bits illustrated in this figure. The interconnect circuit 2300 includes a 4-to-1 multiplexer circuit 2350 and a VPA 2355, which together subsume all the functionalities of the switching multiplexers 1740, configuration storage elements 1130, and 8-to-1 multiplexer 2310.

The VPA structure 2355 is formed by two sets of lines that overlap. Typically, the two sets of lines appear on two different wiring layers of the IC, although these lines might appear on three or more layers in some embodiments. The first set of overlapping lines is a set of eight input lines 2315, while the second set of overlapping lines is a set of four lines 2360 that are the inputs of the multiplexer 2350. As shown in FIG. 23, each line in the first set is at a 90° angle to each line in the second set. In other embodiments, each line in the first set might not overlap every line in the second set, and/or each overlap might not be a 90° angle.

As shown in FIG. 23, the VPA structure 2355 includes a potential via 2365 at the overlap of each first-set line 2315 and each second-set line 2360. FIG. 23 identifies as black boxes the vias that need to be defined in the VPA structure 2355, so that the interconnect circuit 2300 can connect its input and output sets 2315 and 2370 in the same manner as the interconnect circuit 2305. Specifically, with these defined vias, the output line 2370 of the VPA interconnect circuit 2300 connects to (1) input line I2 through via 2372 during phase 00, (2) input line I5 through via 2374 during phase 01, (3) input line I7 through via 2376 during phase 10, and (4) input line I4 through via 2378 during phase 11. This connection scheme is identical to the connection scheme of the interconnect circuit 2305 as described above.

VPA interconnect circuits (such as circuits 2100, 2200, and 2300) have several advantages. For instance, they do not use costly SRAM cells to store configuration data. Instead, they encode such configuration data in their VPA's. VPA interconnects are also very efficient switching circuits, as they avoid much of the transistor switch logic of non-VPA interconnect circuit by using vias for their switching. In other words, non-VPA interconnect circuits supply configuration data through switching and storage circuits that have many transistors on the IC substrate. Such switching requires signals to traverse back and forth between the higher wiring layers and the IC substrate. VPA interconnects avoid these space- and time-consuming switching and storage circuits by defining vias that act as switches between two wiring layers. Hence, IC's that use VPA interconnects can be smaller and faster than traditional configurable IC's (e.g., FPGA's) while having cheaper masks than traditional ASIC's.

Figure 24:
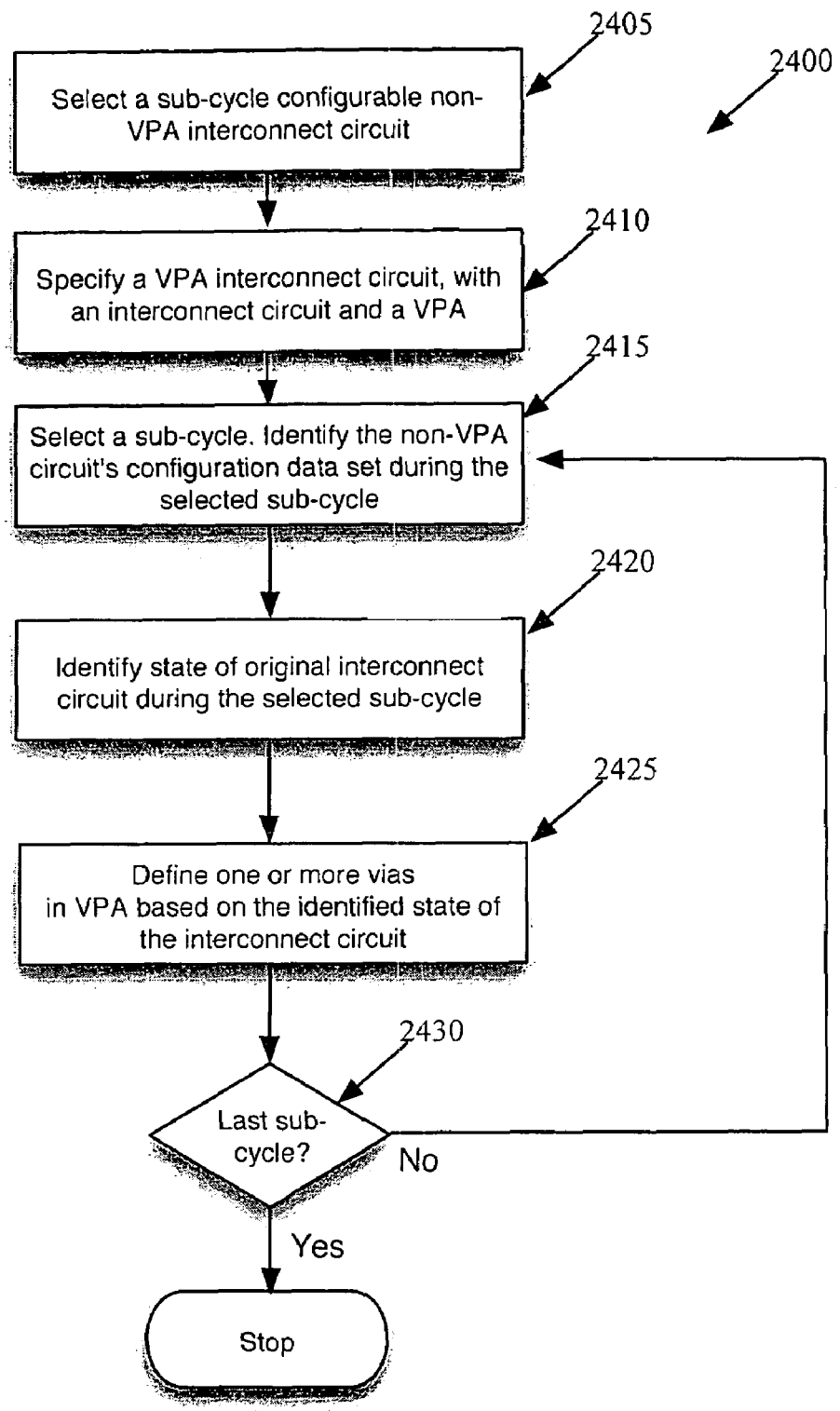
FIG. 24 conceptually illustrates a process that transforms a non-VPA configurable interconnect circuit into a VPA configurable interconnect circuit.

B. Process for Transforming a Non-VPA Configurable Interconnect Circuit to a VPA Configurable Interconnect Circuit FIG. 24 conceptually illustrates a process 2400 that transforms a non-VPA configurable interconnect circuit into a VPA configurable interconnect circuit. This process will be explained by reference to the above-described example that was illustrated in FIG. 23. As shown in FIG. 24, the process 2400 initially selects (2405) a sub-cycle configurable non-VPA interconnect circuit to transform to a VPA configurable interconnect circuit. For instance, at 2405, the process selects non-VPA configurable interconnect circuit 2305 of FIG. 23. The selected non-VPA interconnect circuit typically includes a core interconnect circuit (e.g., the interconnect circuit 2310 of FIG. 23) and a switching circuit (e.g., the switching circuit 2380 of FIG. 23) that supplies a configuration data set to the core interconnect circuit during each sub-cycle.

Next, at 2410, the process specifies a VPA interconnect circuit, which includes a core interconnect circuit and a VPA structure. The core interconnect circuit and the VPA structure of the VPA circuit are specified based on the core interconnect circuit of the selected non-VPA circuit, the number of sub-cycles, and the number of inputs. In the example illustrated in FIG. 23, there are only four sub-cycles. During each of these four cycles, the core interconnect circuit 2310 relays the signal from one of its input lines 2315 to its one output line 2320. Accordingly, for this example, the process specifies (at 2410) a core interconnect circuit that has at least one output line and at least four input lines. Also, given that the core interconnect circuit 2310 receives eight input lines, the VPA structure that is specified at 2410 needs to be eight lines wide in the input signal direction. Accordingly, these minimum requirements result in the specification (at 2410) of the 4-to-1 multiplexer 2350 and VPA structure 2355 of FIG. 23.

After specifying (at 2410) the structure of the VPA interconnect circuit, the process 2400 (at 2415) selects one of the sub-cycles and identifies the configuration data set that is received during this sub-cycle by the core interconnect circuit of the non-VPA circuit. For instance, in the example illustrated in FIG. 23, the process could (at 2415) select the sub-cycle 00 and thus identify 001 as the configuration data set 2325 during this sub-cycle.

Next, at 2420, the process 2400 identifies the state of the core interconnect circuit during the selected sub-cycle for the identified configuration data set. For instance, in the example illustrated in FIG. 23, the process determines (at 2420) that the core interconnect circuit 2310 relays the signal from the input line I2 to its output line 2320 when it receives the configuration data set 001 during the sub-cycle 00.

Based on the state of the interconnect circuit that it identified at 2420, the process 2400 then defines (at 2425) one or more vias in the VPA structure that was specified at 2410. In the example illustrated in FIG. 23, the process defines (at 2425) the via 2372 to allow the input I2 to be communicatively coupled to the output line 2370 of the VPA circuit 2300 during the sub-cycle 00.

After 2425, the process determines (at 2430) whether it has examined all of the sub-cycles. If not, the process (at 2415) selects another sub-cycle and identifies the configuration data set that is received during this sub-cycle by the core interconnect circuit of the non-VPA circuit. The process then transitions back to 2420 to identify the state of the core interconnect circuit during the selected sub-cycle for the identified configuration data set and then to 2425 to define a via in the VPA structure to account for this state. In this manner, the process 2400 loops through 2415-2430 until it defines a via in the VPA structure to account for all the possible states of the non-VPA interconnect circuit. For example, after identifying via 2372 in the example illustrated in FIG. 23, the process loops through 2415-2430 three more times to define vias 2374, 2376, and 2378 to account for the connection of inputs I5, I7, and I4 during sub-cycle phases 01, 10, and 11. When the process 2400 determines (at 2430) that it has examined the non-VPA circuit's operation during all potential sub-cycles, the process 2400 terminates.

VI. Configurable Logic Circuit with VPA Structure

Figure 25:
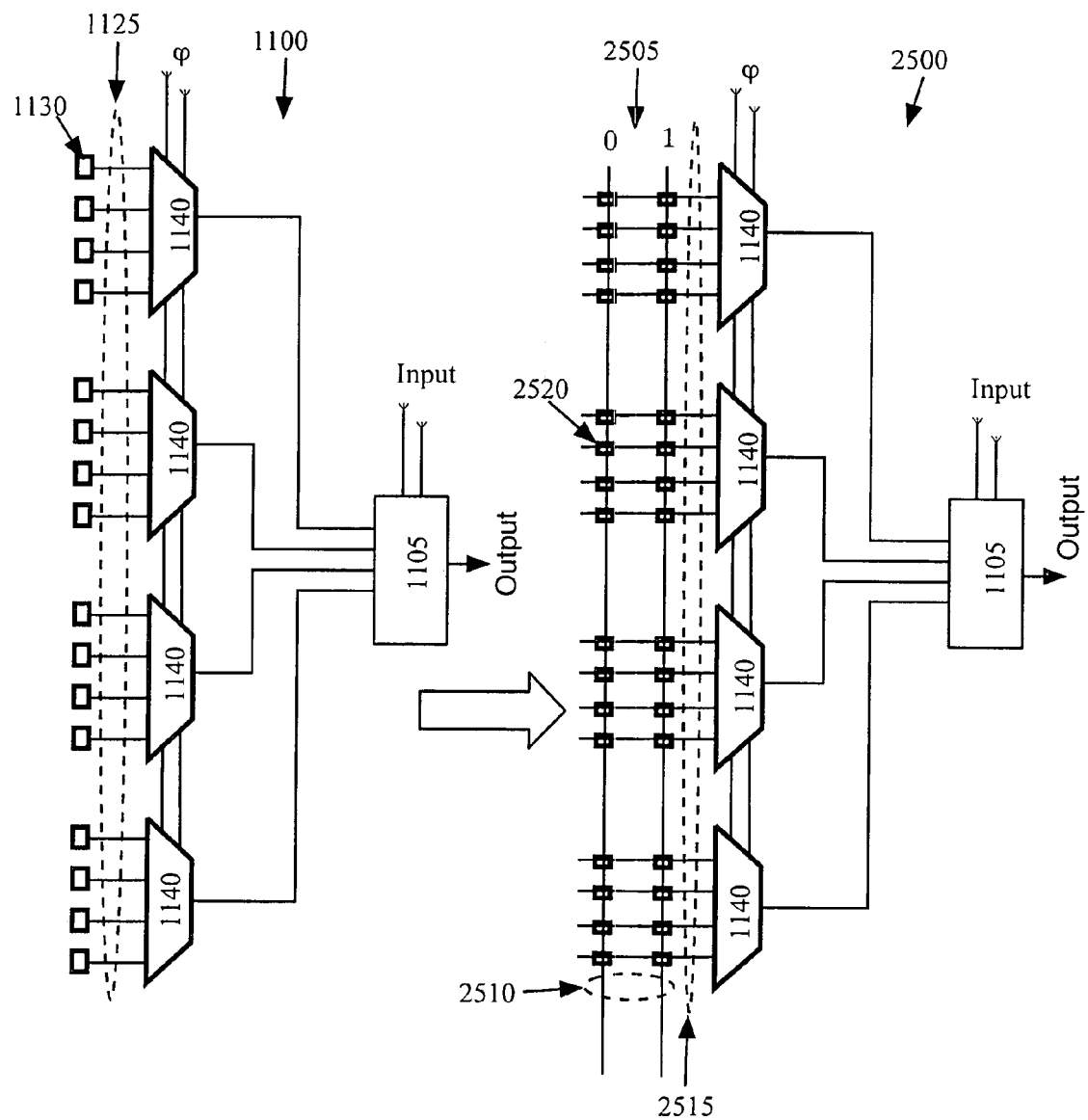
FIG. 25 illustrates an example of VPA configurable logic circuits.

Some embodiments of the invention are VPA configurable logic circuits. FIG. 25 illustrates an example of one such logic circuit 2500. As shown in this figure, the VPA configurable logic circuit 2500 is functionally equivalent to the logic circuit 1100 of FIG. 11. The only structural difference between the logic circuits 2500 and 1100 is that the memory cells 1130 of the logic circuit 1100 have been replaced by a VPA structure 2505 in logic circuit 2500.

The VPA structure 2505 is formed by two sets of lines that overlap. Typically, the two sets of lines appear on two different wiring layers of the IC, although these lines might appear on three or more layers in some embodiments. The first set includes two lines 2510, one of which carries the 0 value, while the other carries the 1 value. The second set of lines is a set of lines 2515 that are the inputs of the multiplexers 1140. As shown in FIG. 25, each line in the first set overlaps each line in the second set at a 90° angle. In other embodiments, each line in the first set might not overlap every line in the second set, and/or each overlap might not be at a 90° angle.

The VPA structure 2505 includes a potential via 2520 at each location where a line in the first set 2510 and a line in the second set 2515 overlap. When the values of the configuration data set stored in the memory cells 1130 are known for the logic circuit 1100, certain vias in the array of potential vias can be set (i.e., defined) to complete the definition of the logic circuit 2500.

Figure 26:
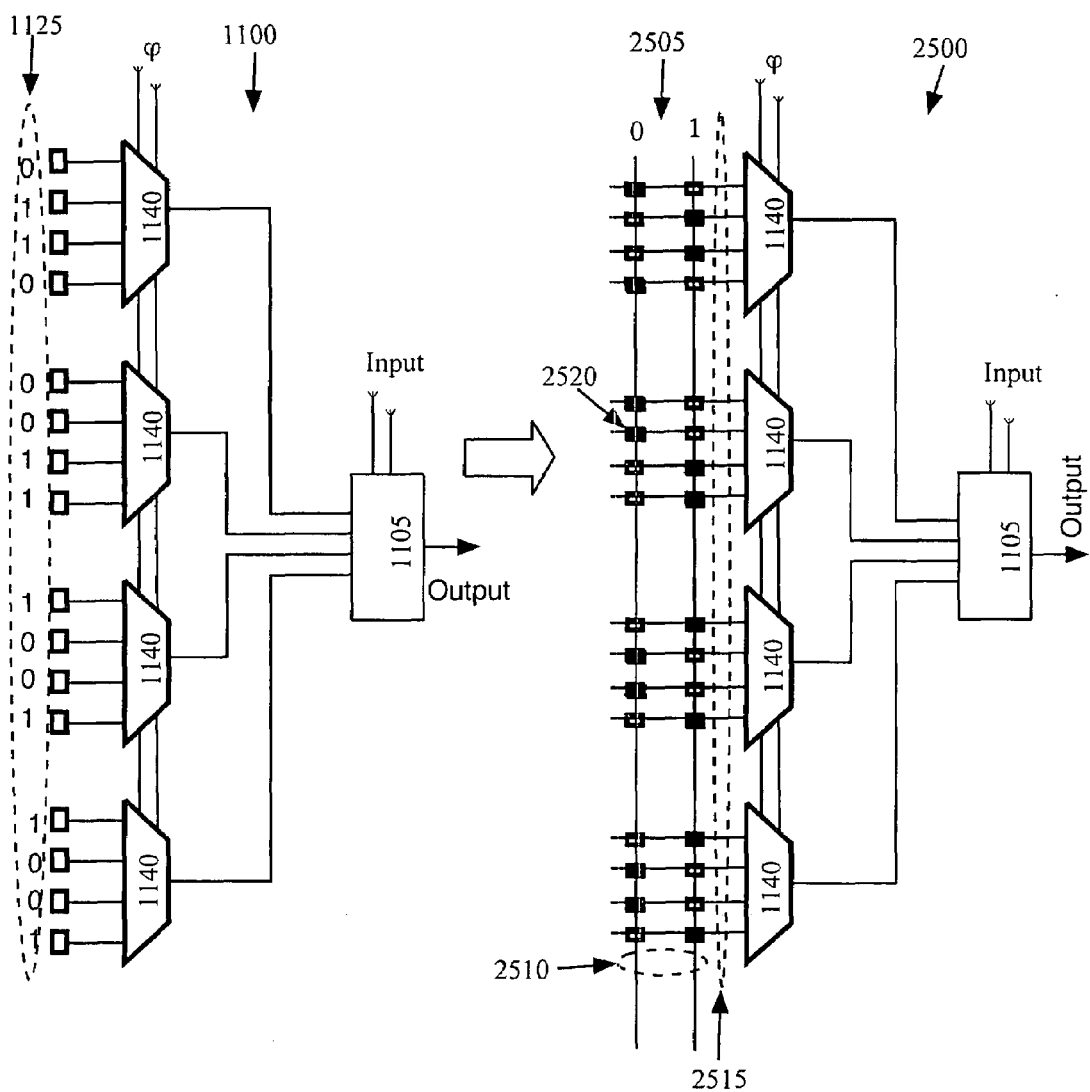
FIG. 26 presents an example that illustrates the setting of vias in a VPA structure of a logic circuit.

FIG. 26 presents an example that illustrates the setting of vias in a VPA structure of a logic circuit. Specifically, this example illustrates a particular configuration data set 1125 for the logic circuit 1100. For this set of configuration data, FIG. 26 then illustrates sixteen black boxes in the VPA structure 2505 that represent the vias that are defined in this structure 2505. These defined vias allow the logic circuit 2500 in FIG. 26 to perform the same function as the logic circuit 1100 in FIG. 26.

Figure 27:
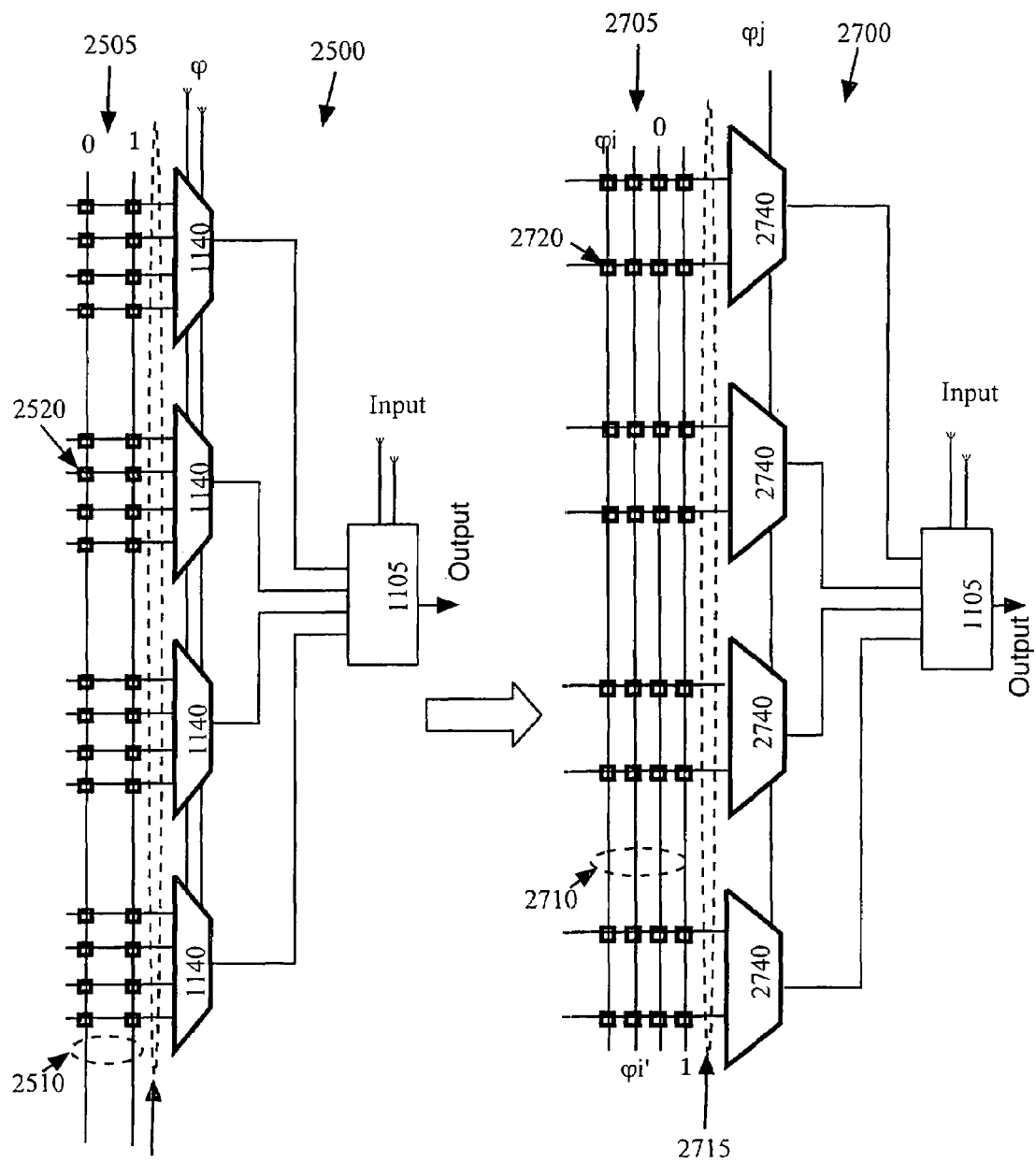
FIG. 27 illustrates an example of the invention's VPA configurable logic circuit, which has phase bits as part of its VPA structure.

In some embodiments, the invention's VPA configurable logic circuits have phase bits as part of their VPA structure. FIG. 27 illustrates an example of one such embodiment. Specifically, this figure illustrates a VPA configurable logic circuit 2700 that is functionally equivalent to the VPA configurable logic circuit 2500 of FIG. 25 and, hence, functionally equivalent to the non-VPA configurable logic circuit 1100 for a known configuration data set and phase signal.

The structure of the logic circuit 2700, however, has two differences from the logic circuit 2500. First, the 4-to-1 switching multiplexers of logic circuit 2500 have been replaced by 2-to-1 switching multiplexers 2740 that are controlled by only the phase bit φj. Second, the other phase bits φi and its complement φi' are part of the VPA structure 2705 of the logic circuit 2700. Specifically, the VPA structure 2705 is formed by two sets of overlapping lines 2710 and 2715. The first set 2710 includes four lines, two of which carry the 0 and 1 values, while the other two carry the phase bit φi and its complement φi'. The second set of lines 2715 are inputs to the multiplexers 2740. As shown in FIG. 27, each line in the first set overlaps each line in the second set at a 90° angle. In other embodiments, each line in the first set might not overlap every line in the second set, and/or each overlap might not be at a 90° angle.

The VPA structure 2705 includes a potential via 2720 at the intersection of each first-set line 2710 and each second-set line 2715. For a particular configuration data set that is stored in the memory cells 1130 of the logic circuit 1100 or that is embedded in the VPA structure 2505 of the logic circuit 2500, certain vias in the VPA 2705 of the logic circuit 2700 can be set (i.e., defined) to complete the definition of the logic circuit 2700.

Figure 28:
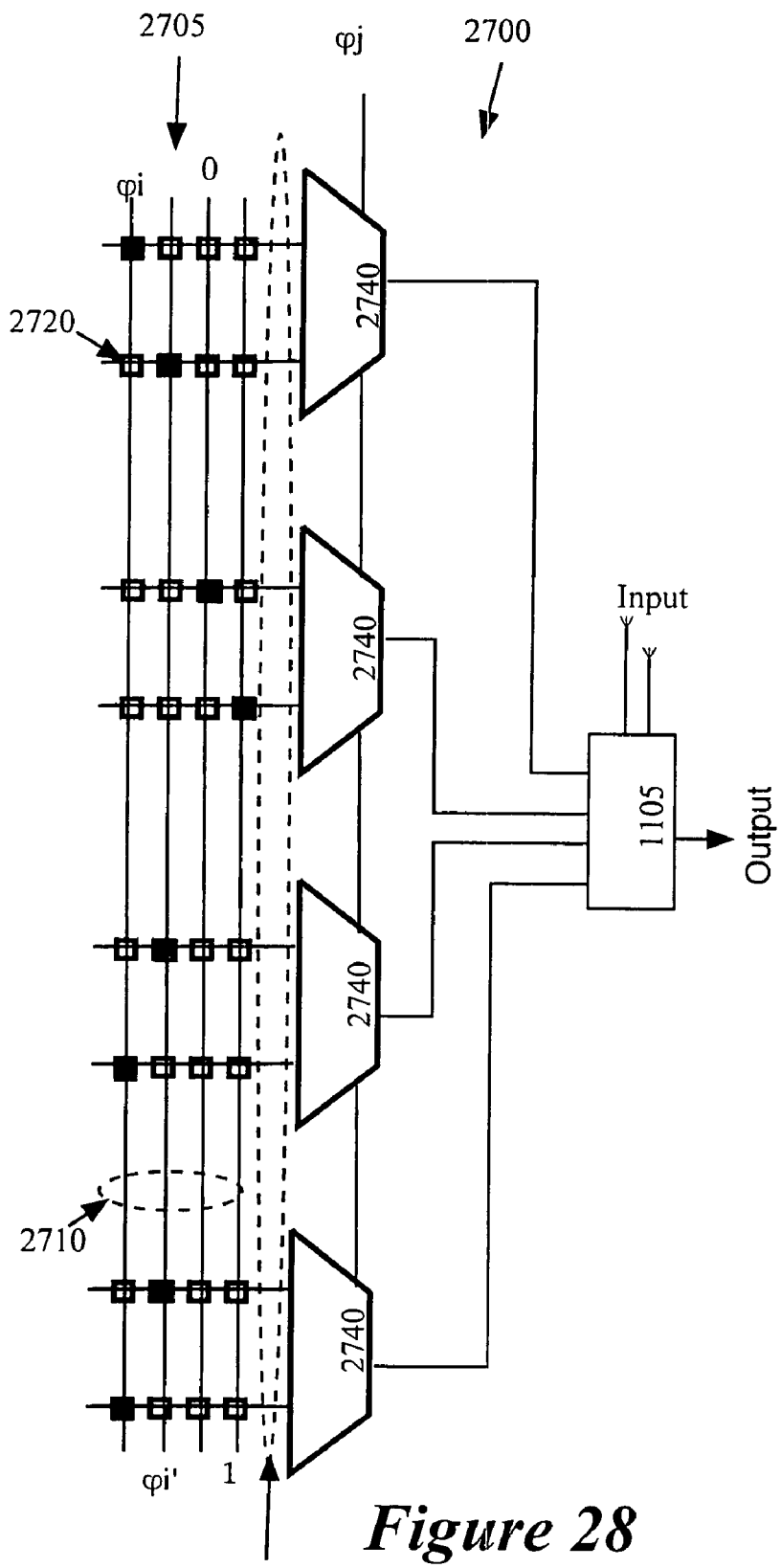
FIG. 28 illustrates an example of the setting of certain vias in the VPA of FIG. 27.

FIG. 28 illustrates an example of the setting of certain vias in the VPA 2705. In this example, the defined vias are shown as black boxes. In FIG. 28, the vias are defined in the VPA 2705 to allow the logic circuit 2700 in this figure to function equivalently to the logic circuits 1100 and 2500 as configured in FIG. 26. Like logic circuit 1300, 1400, and 1500, the logic circuits 2500 and 2700 of FIGS. 25-28 are commutative with respect to the ordering of the input data set and the sub-cycle signals when the core logic circuits 1105 in these circuits is a multiplexer or some other logic circuit that is commutative. Hence, in some embodiments, the invention's VPA configurable logic circuits can have input bits as part of its VPA structure.

VII. Configurable IC and System

Figure 29:
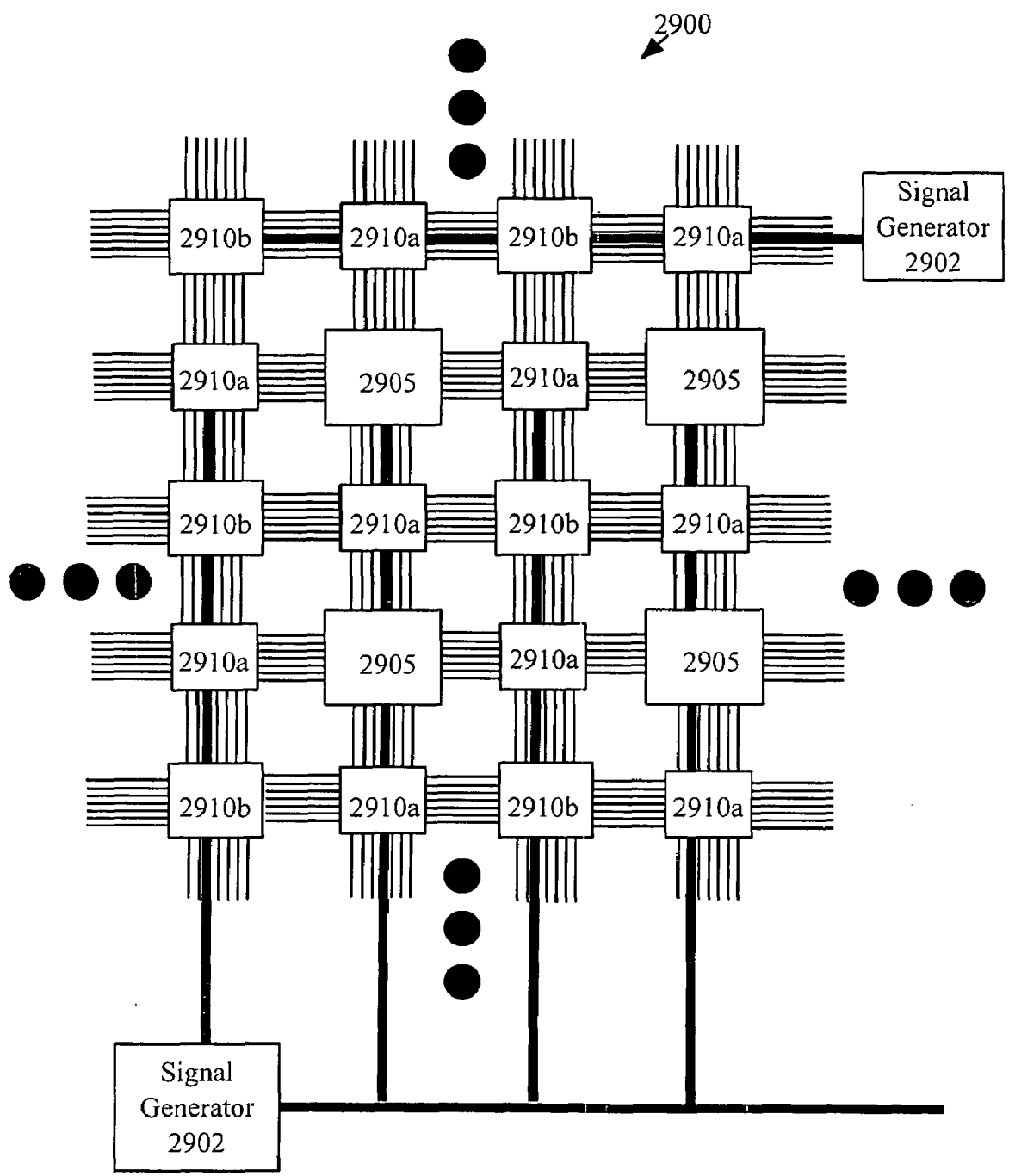
FIG. 29 illustrates a portion of a configurable IC that has an array of logic circuits and interconnect circuits.

FIG. 29 illustrates a portion of a configurable IC 2900 that has an array of logic circuits 2905 and interconnect circuits 2910. A logic circuit 2905 can be any of the configurable logic circuits illustrated in FIGS. 11-16 and 25-28, or it can include several of the configurable logic circuits illustrated in FIGS. 11-16 and 25-28. Similarly, an interconnect circuit 2910 can be any configurable interconnect circuit described above by reference to FIGS. 17-21, or it can include several of the configurable interconnect circuits illustrated in these figures. Alternatively, in some embodiments, some or all of the logic or interconnect circuits illustrated in FIG. 29 might not be configurable.

As shown in FIG. 29, the IC 2900 has two types of interconnect circuits 2910a and 2910b. Interconnect circuits 2910a connect interconnect circuits 2910b and logic circuits 2905 (i.e., connect logic circuits 2905 to other logic circuits 2905 and interconnect circuits 2910b, and connect interconnect circuits 2910b to other interconnect circuits 2910b and logic circuits 2905). Interconnect circuits 2910b, on the other hand, connect interconnect circuits 2910a to other interconnect circuits 2910a.

As shown in FIG. 29, the IC 2900 includes several signal generators 2902 that control the reconfiguration of the circuits 2905 and 2910. In some embodiments, the signal generators are sub-cycle signal generators that generate signals that enable some or all of the logic circuits to be sub-cycle configurable, as described above. In some embodiments, the signal generators are not directly connected to all logic and interconnect circuits that they control. For instance, in some of these embodiments, the signals from these generators are routed to the appropriate configurable circuits through the configurable interconnect circuits 2910.

Although two signal generators are illustrated in FIG. 29, other configurable IC's of the invention use more or fewer signal generators. For instance, the configurable IC's of some embodiments might only have one signal generator, or might not have a signal generator but instead might connect to a signal generator outside of the IC.

In some embodiments, the configurable IC 2900 has a large number of logic and interconnect circuits (e.g., hundreds, thousands, etc. of such circuits). The configurable IC's of some embodiments might employ different architectures for arranging their logic and interconnect circuits. For instance, some embodiments might use a LAB architecture (a logic-array-block architecture), other symmetrical or asymmetrical architectures. Some embodiments might also use some of the architectural arrangements disclosed in U.S. patent application entitled "Configurable Integrated Circuit Architecture," having Ser. No. 10/882,713, filed concurrently with this application. This Application is incorporated in the present application by reference.

In some embodiments, all logic circuits or large sets (e.g., hundreds) of logic circuits of the configurable IC have the same circuit structure (e.g., the same circuit elements and wiring between the circuit elements). Similarly, in some embodiments, the configurable IC will have all of its interconnect circuits or large sets (e.g., hundreds) of its interconnect circuits have the same circuit structure. Re-using the same circuit structure for a large set of logic circuits or a large set of interconnect circuits simplifies the design and manufacturing of the configurable IC. Alternatively, some embodiments might use numerous different structures for their logic circuits and/or their interconnect circuits.

Figure 30:
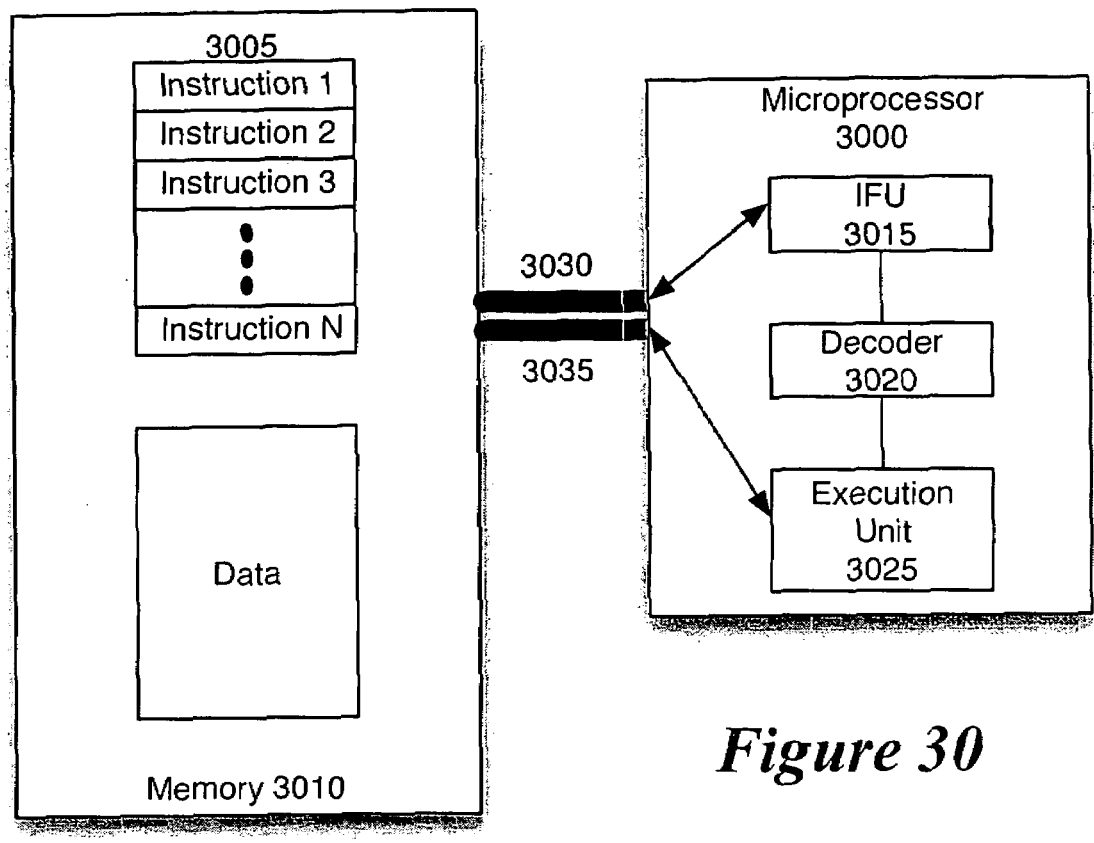
FIG. 30 illustrates a traditional microprocessor design.

In some embodiments, the logic circuits of the configurable IC 2900 are not traditional processing units that use traditional microprocessor designs (such as the Von Neumann design). FIG. 30 illustrates a traditional microprocessor design. A typical microprocessor 3000 often operates by repetitively performing fetch, decode, and execute operations. Specifically, as shown in FIG. 30, a microprocessor typically has an instruction processing pipeline that (1) fetches an encoded instruction from a program 3005 in memory 3010, (2) decodes this instruction, (3) executes the decoded instruction, and (4) writes the result of the execution back to memory. The program is generated from a fixed set of encoded instructions upon which the design of the microprocessor is based. A microprocessor's instruction processing pipeline often includes an instruction fetch unit 3015 for fetching instructions, a decoder 3020 for decoding the instructions, and one or more processing units 3025 for executing the decoded instruction. A microprocessor might have several instruction processing pipelines in order to perform several fetch-decode-execute cycles in parallel. In such cases, the microprocessor often has a separate decoder for each pipeline. As shown in FIG. 30, a traditional microprocessor uses separate address and data buses 3030 and 3035 to identify locations in memory to read and write.

As mentioned above, in some embodiments, the logic circuits 2905 of the configurable IC 2900 do not use traditional microprocessor designs. This is because these logic circuits do not employ a fetch-decode-execute operational cycle. Instead, these logic circuits (1) can directly receive configuration data sets that configure the logic circuits to perform certain operations, and (2) can directly pass the results of their operations to other logic circuits.

Figure 31:
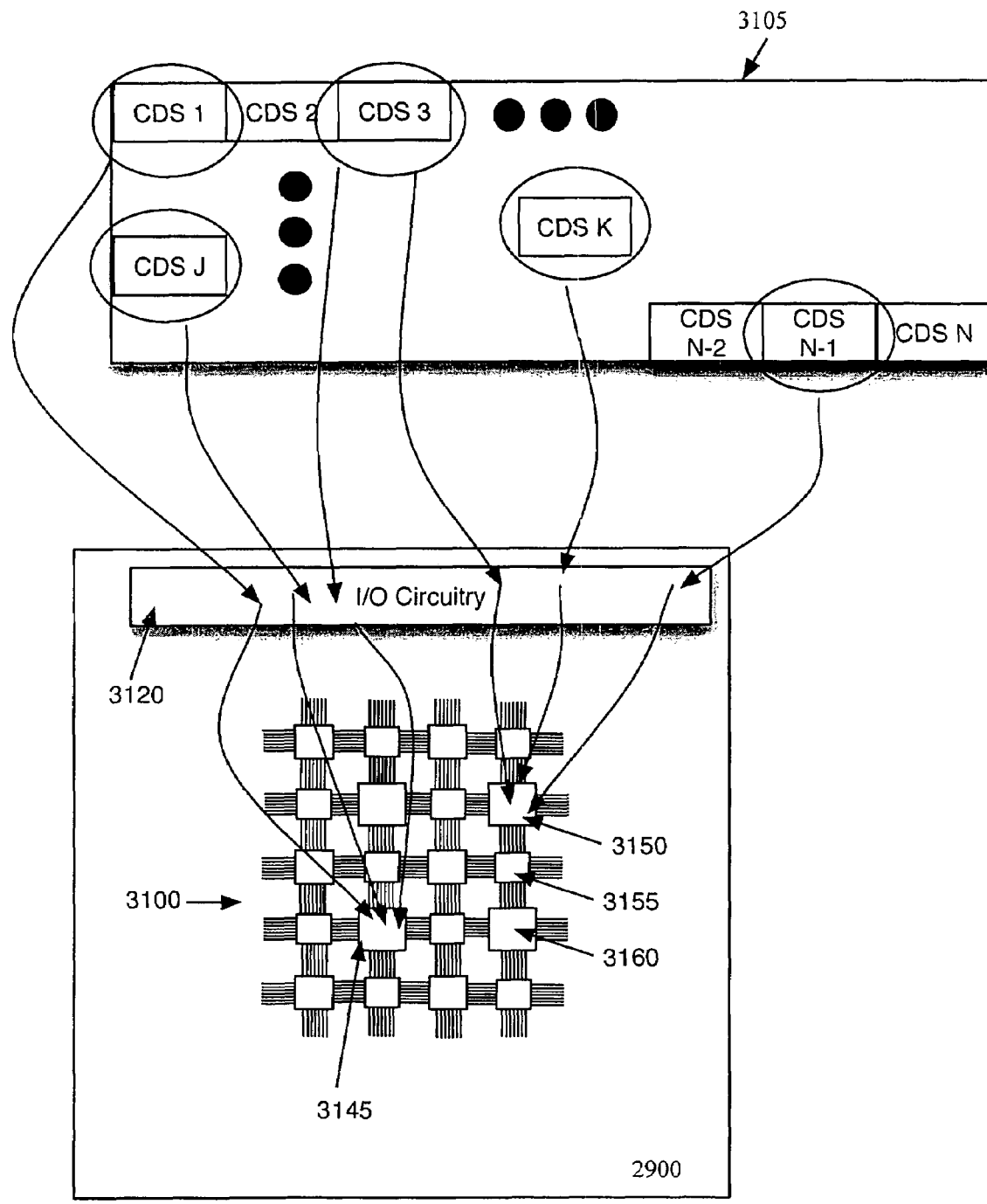
FIG. 31 illustrates a configuration data pool for the configurable IC.

FIG. 31 illustrates a more detailed example of this. Specifically, this figure illustrates a configuration data pool 3105 for the configurable IC 2900. This pool includes N configuration data sets (CDS). This pool is stored in one or more memory/storage units, such as SRAMs, DRAMs, Flash, shift registers, disk, etc.

As shown in FIG. 31, an input/output circuitry 3120 of the configurable IC 2900 routes different configuration data sets to different configurable logic and interconnect circuits of the IC 2900. The I/O circuitry 3120 can directly route numerous configuration data sets to numerous configurable circuits without first passing the configuration data through one or more decoders. Also, a configuration data set (CDS) might be sent to numerous (e.g., 5) different configurable circuits (e.g., configurable logic circuits 3125).

For instance, FIG. 31 illustrates configurable circuit 3145 receiving configuration data sets 1, 3, and J through the I/O circuitry, while configurable circuit 3150 receives configuration data sets 3, K, and N-1 through the I/O circuitry. In some embodiments, the configuration data sets are stored within each configurable circuit. Also, in some embodiments, a configurable circuit can store multiple configuration data sets so that it can reconfigure quickly by changing to another configuration data set. In some embodiments, some configurable circuits store only one configuration data set, while other configurable circuits store multiple such data sets.

In configurable IC 2900, the logic circuits can receive as input data the outputs of other logic circuits (i.e., the logic circuits can pass the result of their operations to other logic circuits without first writing these results in memory and having other logic circuits retrieve these results from memory). For example, in FIG. 31, the logic circuit 3150 might pass its output to the logic circuit 3160 through the interconnect circuit 3155 without first storing this output in a memory outside of the circuit array 3100 illustrated in this figure.

In some embodiments, some of the logic circuits 2905 of the configurable IC 2900 of FIG. 29 do not use traditional microprocessor designs, while other logic circuits 2905 use traditional microprocessor designs. For instance, in some embodiments, some logic circuits 2905 of the IC 2900 are Von Neumann processors that use the fetch-decode-execute operational cycle described above. In other embodiments, all the logic circuits 2905 of the IC 2900 are traditional, Von Neumann processors.

Figure 32:
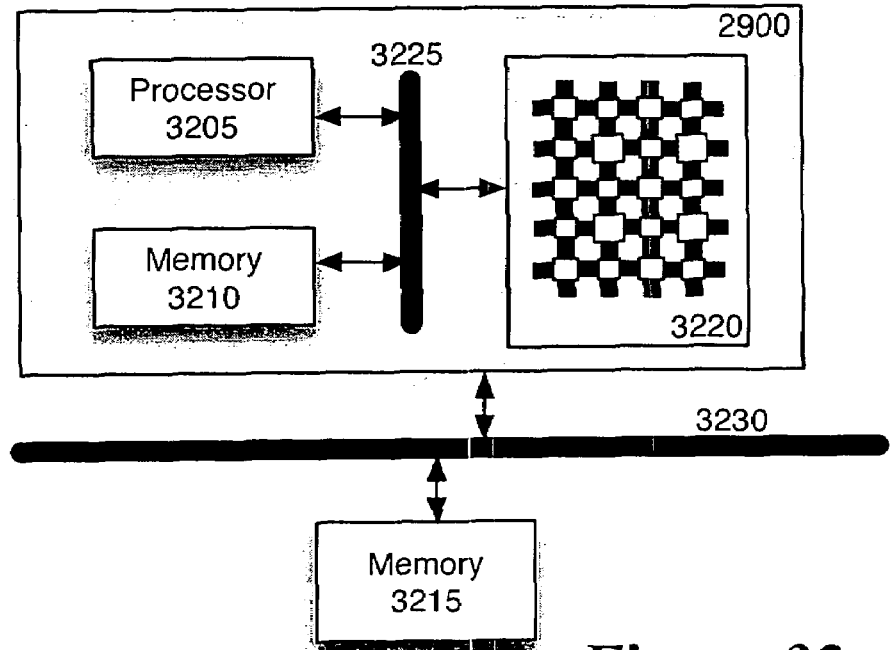
FIG. 32 illustrates an IC that has an array of non-traditional processing units and configurable interconnects.

Yet in other embodiments, the configurable IC 2900 includes (1) an array of configurable logic circuits that do not use a traditional processor design, and (2) processor units outside of the array that use a traditional processor design. FIG. 32 illustrates one such example. Specifically, this figure illustrates the IC 2900 as having an array 3220 of non-traditional processing units 2905 and configurable interconnects 2910. The processing units are logic circuits that are configured and operated according to the approach illustrated in FIG. 31. FIG. 32 also shows the IC 2900 as having one on-chip processor 3205 that follows the traditional Von Neumann design that was described above in FIG. 30. This on-chip processor 3205 can read and write instructions and/or data from an on-chip memory 3210 or an offchip memory 3215. The processor 3205 can communicate with the configurable array 3220 through memory 3210 and/or 3215 through on-chip bus 3225 and/or off-chip bus 3230. The buses 3225 and 3230 collectively represent all conductive paths that communicatively connect the devices or components illustrated in FIG. 32.

Figure 33:
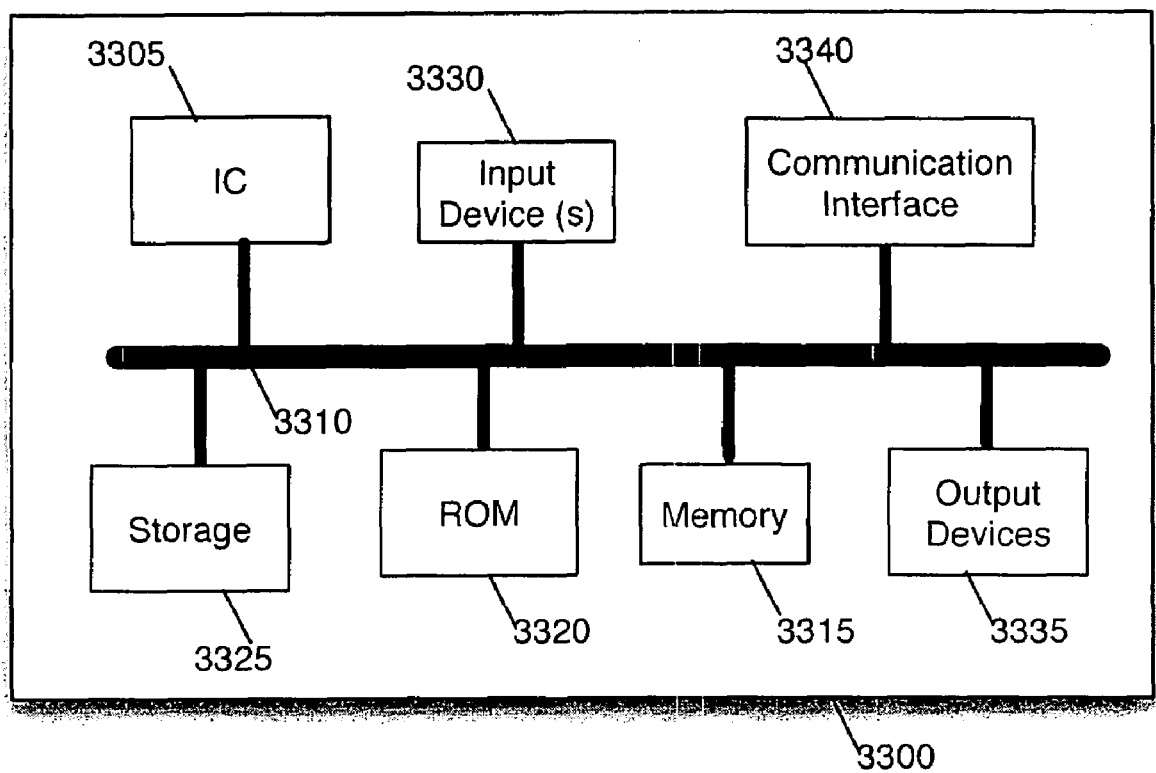
FIG. 33 conceptually illustrates a more detailed example of a computing system that includes an IC of the invention.

FIG. 33 conceptually illustrates a more detailed example of a computing system 3300 that includes an IC 3305 of the invention. This system 3300 can be a stand-alone computing or communication device, or it can be part of another electronic device. As shown in FIG. 33, the system 3300 not only includes the IC 3305, but also includes a bus 3310, a system memory 3315, a read-only memory 3320, a storage device 3325, input devices 3330, output devices 3335, and communication interface 3340.

The bus 3310 collectively represents all system, peripheral, and chipset interconnects (including bus and non-bus interconnect structures) that communicatively connect the numerous internal devices of the system 3300. For instance, the bus 3310 communicatively connects the IC 3305 with the read-only memory 3320, the system memory 3315, and the permanent storage device 3325.

The configuration data pool is stored in one or more of these memory units in some embodiments of the invention. Also, from these various memory units, the IC 3305 receives data for processing and configuration data for configuring the IC's configurable logic and/or interconnect circuits. When the IC 3305 has a processor, the IC also retrieves from the various memory units instructions to execute. The read-only-memory (ROM) 3320 stores static data and/or instructions that are needed by the IC 3305 and other modules of the system 3300. The storage device 3325, on the other hand, is read-and-write memory device. This device is a non-volatile memory unit that stores instruction and/or data even when the system 3300 is off. Like the storage device 3325, the system memory 3315 is a read-and-write memory device. However, unlike storage device 3325, the system memory is a volatile read-and-write memory, such as a random access memory.

The system memory stores some of the instructions and/or data that the IC needs at runtime.

The bus 3310 also connects to the input and output devices 3330 and 3335. The input devices enable the user to enter information into the system 3300. The input devices 3330 can include touch-sensitive screens, keys, buttons, keyboards, cursor-controllers, microphone, etc. The output devices 3335 display the output of the system 3300.

Finally, as shown in FIG. 33, bus 3310 also couples system 3300 to other devices through a communication interface 3340. Examples of the communication interface include network adapters that connect to a network of computers, or wired or wireless transceivers for communicating with other devices. One of ordinary skill in the art would appreciate that any other system configuration may also be used in conjunction with the invention, and these system configurations might have fewer or additional components.

One of ordinary skill will realize that the configurable circuits, IC's, and systems described above have numerous advantages. For instance, the logic and interconnect circuits can reconfigure and execute multiple times within one design or interface cycle, as they are sub-cycle configurable. By configuring and executing these circuits on a sub-cycle basis, a smaller, faster IC can be specified. Such a smaller, faster IC can be used to implement the design of a larger, slower IC, at a fraction of the cost for manufacturing the larger IC.

Also, several of the invention's logic and interconnect circuits can be reconfigured in a non-sequential manner. Rather, each of these circuits can be reconfigured to perform a number of operations in a number of arbitrary sequences. These circuits can be reconfigured in such a non-sequential manner because the sub-cycle signal generator 700 can generate a sub-cycle signal that has no particular pattern, which, in turn, allows these circuits to supply any desirable, arbitrary sequence of configuration data sets to their core interconnect or logic circuits.

On the other hand, the signal generator in some embodiments generates a sub-cycle signal that has a pattern that may or may not sequentially increment or decrement through all possible values of the signal. Such flexibility in the signal generation and the architecture of the configurable circuits provides tremendous gains in speed and size of the configurable IC.

While the invention has been described with reference to numerous specific details, one of ordinary skill in the art will recognize that the invention can be embodied in other specific forms without departing from the spirit of the invention. For instance, although FIG. 29 illustrates an IC with homogenous architectures, the IC's of other embodiments might use heterogeneous architectures (e.g., SOC architectures) such as the one illustrated in FIG. 32.

Also, the VPA circuits of FIGS. 21-28 are sub-cycle reconfigurable VPA interconnect circuits as they receive a sub-cycle signal 1150. In other embodiments, however, these interconnect circuits might not be sub-cycle reconfigurable. For instance, they might receive a different set of signals than the phase signal 1150.

One of ordinary skill will also realize that there might be intervening devices between the logic and/or interconnect circuits described above. For instance, in the logic circuit 1100 of FIG. 11, buffers can be placed between the multiplexers 1140 and circuit 1105 and/or after the circuit 1105. Buffer circuits are not logic or interconnect circuits. Buffer circuits can be used to achieve one or more objectives (e.g., maintain the signal strength, reduce noise, delay signal, etc.) for connections between circuits. Inverting buffer circuits also allow an IC design to reconfigure logic circuits less frequently and/or use fewer types of logic circuits. In some embodiments, buffer circuits are formed by one or more inverters (e.g., two or more inverters that are connected in series).

Alternatively, the intermediate circuits between the logic and/or interconnect circuits can be viewed as a part of the devices illustrated in these figures. For instance, the inverters that can be placed after the devices 1105 and 1140 can be viewed as being part of these devices. Some embodiments use such inverters in order to allow an IC design to reconfigure logic circuits less frequently and/or use fewer types of logic circuits.

Also, although several of the above-described embodiments reconfigure both interconnect and logic circuits, one of ordinary skill will realize that some embodiments do not reconfigure both interconnect and logic circuits. For instance, some embodiments only reconfigure interconnect circuits on a sub-cycle basis. Some of these embodiments might never reconfigure the logic circuits, or might reconfigure these circuits at a slower rate than the sub-cycle rate.

In addition, although FIGS. 5 and 6 illustrate IC's with dedicated interface circuits, one of ordinary skill will realize that IC's of some embodiments do not have dedicated interface circuits. For instance, in some embodiments, the IC's have circuits that are reconfigured into interface circuits periodically to receive or output signals.

Although some of the timing diagrams show the sub-cycle phases as falling completely within a primary cycle, one of ordinary skill understand that the sub-cycle phases might be offset by some amount form their associated primary cycles. Thus, one of ordinary skill in the art would understand that the invention is not to be limited by the foregoing illustrative details, but rather is to be defined by the appended claims.

We claim:

1. An integrated circuit (IC) comprising:
   a) a set of logic circuits, each logic circuit in the set for receiving input data sets and configuration data sets and performing a particular set of functions on the input data sets, wherein each configuration data set specifies a particular function that a logic circuit has to perform on an input data set;
   b) for each particular logic circuit in the set, a particular connection circuit for supplying sets of the configuration data to the particular logic circuit at a particular rate for at least a particular time period, wherein at least two configuration data sets that configure at least a particular logic circuit are different and configure the particular logic circuit to perform two different functions on the input data; and
   c) a set of interconnect circuits for communicatively coupling the logic circuits;
   wherein each interconnect circuit in at least a sub-set of the interconnect-circuit set has an input terminal set, an output terminal set, and a plurality of connection schemes for communicatively coupling the interconnect circuit's input terminal and output terminal sets;
   each particular interconnect circuit in the sub-set for receiving different configuration data sets and, based on at least two different configuration data sets, selecting at least two different connection schemes that connect the particular interconnect circuit's input terminal and output terminal sets differently.

2. The IC of claim 1, wherein the set of logic circuits includes at least one hundred logic circuits.

3. The IC of claim 1, wherein at least a plurality of the interconnect circuits are for communicatively coupling other interconnect circuits.

4. The IC of claim 1, wherein the set of interconnect circuits includes at least one hundred interconnect circuits.

5. The IC of claim 1 further comprising a storage for storing configuration data, wherein each particular connection circuit communicatively couples to the particular logic circuit and to the storage to supply sets of configuration data stored in the storage to the logic circuit.

6. The IC of claim 5, wherein the storage comprises memory cells.

7. The IC of claim 6, wherein the logic circuit is a core logic circuit that is part of a larger logic circuit, wherein the larger logic circuit further includes the connecting circuit and the memory cells, wherein the memory cells are read-writeable memory cells.

8. The IC of claim 1, wherein during the operation of the IC, each particular connection circuit receives a control signal that directs the particular connection circuit to supply configuration data sets to the particular logic circuit at the particular rate.

9. The IC of claim 8, wherein the control signal has a rate that is at least equal to the particular rate.

10. The IC of claim 9, wherein the control signal is a clock signal.

11. The IC of claim 9, wherein the control signal has a value that changes at the rate of the control signal.

12. An integrated circuit (IC) comprising:
a) multiple wiring layers;
b) a logic circuit for receiving input data sets and configuration data sets and performing a plurality of functions on the input data sets, wherein each configuration data set specifies a particular function that the logic circuit has to perform on the input data set;
c) a connection circuit for supplying individual configuration data sets to the logic circuit at a particular periodic rate for at least a particular time period, wherein at least two supplied configuration data sets are different and configure the logic circuit to perform two different functions on the input data, wherein the connection circuit has a first set of input terminals;
d) a second set of input terminals for carrying data, wherein a plurality of the second set of input terminals overlap a plurality of the first set of input terminals; and
e) a set of vias, wherein each via connects a first-set input terminal to a second-set input terminal on a different wiring layer than the first-set input terminal.

13. The IC of claim 12, wherein the connection circuit receives configuration data through the via connections between the first and second input terminal sets.

14. The IC of claim 12, wherein the data earned on the second set of input terminals is 0 or 1 Boolean data.

15. A configurable logic circuit for an integrated circuit (IC), the configurable logic circuit comprising:
a first logic circuit for receiving input data sets and configuration data sets and for performing a set of at least two functions;
a second circuit communicatively coupled to the first logic circuit, the second circuit for supplying configuration data sets to the first logic circuit at a particular periodic rate for at least a particular time period, wherein at least two supplied configuration data sets are different and configure the first logic circuit to perform two different functions on the input data, wherein the second circuit is an interconnect circuit that has a set of control inputs for receiving control signals for directing the interconnect circuit (i) to select different configuration data sub-sets from the storage, and (ii) to provide the selected configuration data sub-sets to the first logic circuit; and a storage for storing a set of configuration data, wherein the second circuit communicatively couples to the storage to receive the configuration data;
wherein the interconnect circuit has data inputs communicatively coupled to the storage, and data outputs communicatively coupled to the first logic circuit, wherein different control signals direct the interconnect circuit to communicatively connect different data inputs of the interconnect circuit to different data outputs of the interconnect circuit.

16. The configurable logic circuit of claim 15, wherein during the operation of the logic circuit, the interconnect circuit receives a control signal that directs the interconnect circuit to supply configuration data sets to the logic circuit at the particular rate for at least a duration of time.

17. The configurable logic circuit of claim 16, wherein the control signal has a rate that is at least equal to the particular rate.

18. The configurable logic circuit of claim 17, wherein the control signal is a clock signal.

19. The configurable logic circuit of claim 17, wherein the control signal has a value that changes at the rate of the control signal.

20. A configurable logic circuit for an integrated circuit (IC) comprising multiple wiring layers, the configurable logic circuit comprising:
a) a first logic circuit for receiving input data sets and configuration data sets and for performing a set of at least two functions; and
b) a second circuit communicatively coupled to the first logic circuit, the second circuit for supplying configuration data sets to the first logic circuit at a particular periodic rate for at least a particular time period, wherein at least two supplied configuration data sets are different and configure the first logic circuit to perform two different functions on the input data, wherein the second circuit has a first set of input terminals;
wherein the IC further comprises a second set of input terminals for carrying data, wherein a plurality of the second set of input terminals overlap a plurality of the first set of input terminals; and
wherein the IC further comprises a set of vias, wherein each via connects a first-set input terminal to a second-set input terminal on a different wiring layer than the first-set input terminal.

21. The configurable logic circuit of claim 20, wherein second circuit receives configuration data through the via connections between the first and second input terminal sets.

22. The configurable logic circuit of claim 21, wherein the data carried on the second set of input terminals is 0 or 1 data.

23. A system comprising:
a) a memory for storing data; and
b) a configurable integrated circuit (IC) communicatively coupled to the memory to receive and process the data, the configurable IC comprising:
1) a set of logic circuits, each logic circuit in the set for receiving input data sets and configuration data sets and performing a particular set of functions on the input data sets, wherein each configuration data set specifies a particular function that a logic circuit has to perform on an input data set;
2) for each particular logic circuit in the set, a particular connection circuit for supplying sets of the configuration data to the particular logic circuit at a particular periodic rate for at least a particular time period, wherein at least two configuration data sets that configure at least a particular logic circuit are different and configure the particular logic circuit to perform two different functions on the input data; and 3) a set of interconnect circuits for communicatively coupling the logic circuits;

wherein each interconnect circuit in at least a sub-set of the interconnect-circuit set has an input terminal set, an output terminal set, and a plurality of connection schemes for communicatively coupling the interconnect circuit's input terminal and output terminal sets;

each particular interconnect circuit in the sub-set for receiving different configuration data sets and, based on at least two different configuration data sets, selecting at least two different connection schemes that connect the particular interconnect circuit's input terminal and output terminal sets differently.

24. The system of claim 23, wherein the set of logic circuits includes at least one hundred logic circuits.

25. The system of claim 23, wherein at least a plurality of the interconnect circuits are for communicatively coupling other interconnect circuits.

26. The system of claim 23, wherein the set of interconnect circuits includes at least one hundred interconnect circuits.

27. The system of claim 23, wherein during an operation of the IC, a connection circuit supplies configuration data sets to the connection circuit's logic circuit at a particular rate for at least a duration of time.

28. A system comprising:

a) a memory for storing data; and b) a configurable integrated circuit (IC) communicatively coupled to the memory to receive and process the data, the configurable IC comprising:

1) multiple wiring layers;

2) a set of logic circuits, each logic circuit in the set for receiving input data sets and configuration data sets and performing a particular set of functions on the input data sets, wherein each configuration data set specifies a particular function that a logic circuit has to perform on an input data set; and 3) for each particular logic circuit in the set, a particular connection circuit for supplying sets of the configuration data to the particular logic circuit at a particular periodic rate for at least a particular time period, wherein at least two configuration data sets that configure at least a particular logic circuit are different and configure the particular logic circuit to perform two different functions on the input data wherein each connection circuit has a first set of input terminals;

4) for each particular connection circuit in a sub-set of connection circuits:

i) a second set of input terminals for carrying data, wherein a plurality of the second set of input terminals overlap a plurality of the first set of input terminals; and ii) a set of vias, wherein each via connects a first-set input terminal to a second-set input terminal on a different wiring layer than the first-set input terminal.

29. The system of claim 28, wherein each particular connection circuit in the sub-set receives configuration data through the via connections between the first and second input terminal sets.

30. The system of claim 29, wherein the data carried on the second set of input terminals is 0 or 1 data.

* * * * *